United States Patent [19]
Kanda et al.

[11] Patent Number: 5,318,917
[45] Date of Patent: Jun. 7, 1994

[54] METHOD OF FABRICATING SEMICONDUCTOR DEVICE

[75] Inventors: Akihiro Kanda; Yoshiro Fujita, both of Osaka; Takehiro Hirai, Kyoto; Mitsuo Tanaka; Hideya Esaki, both of Osaka, all of Japan

[73] Assignee: Matsushita Electric Industrial Co., Ltd., Osaka, Japan

[21] Appl. No.: 15,191

[22] Filed: Feb. 10, 1993

Related U.S. Application Data

[60] Division of Ser. No. 750,856, Aug. 29, 1991, Pat. No. 5,204,274, which is a continuation-in-part of Ser. No. 431,581, Nov. 3, 1989, abandoned.

[30] Foreign Application Priority Data

Nov. 4, 1988 [JP] Japan .................. 63-278700

[51] Int. Cl.$^5$ .......................................... H01L 21/265
[52] U.S. Cl. ..................................... 437/31; 437/162; 148/DIG. 11; 148/DIG. 124
[58] Field of Search ............... 437/31, 162, 59, 55, 437/57

[56] References Cited

U.S. PATENT DOCUMENTS 4,375,999 3/1983 Nawata et al. .................. 437/162
4,546,536 10/1985 Anantha et al. ................... 437/31

(List continued on next page.)

FOREIGN PATENT DOCUMENTS 0033495 8/1981 European Pat. Off.
0135408 3/1985 European Pat. Off.
0139165 5/1985 European Pat. Off.

OTHER PUBLICATIONS

Yoshiji Kobayashi et al, "High Speed IC Fabricated by SST4 Process", 1986 National Meeting of the Institute of Electronics and Communication Engineers of Japan.

(List continued on next page.)

Primary Examiner—Brian E. Hearn
Assistant Examiner—Tuan Nguyen
Attorney, Agent, or Firm—Lowe, Price, LeBlanc & Becker

[57] ABSTRACT

A method of fabricating a semiconductor device includes the steps of forming a base diffusion layer in a predetermined region in a semiconductor substrate of a first conduction type, the base diffusion layer being of a second conduction type; forming first insulating films and simultaneously forming an emitter lead-out electrode and a collector lead-out electrode in regions above an emitter-contact-forming region and a collector-contact-forming region, the first insulating films extending on the emitter and collector lead-out electrodes, the emitter and collector lead-out electrodes including impurity corresponding to the first conduction type; forming second insulating films at sides of the emitter and collector lead-out electrodes; forming a base contact; forming a base lead-out electrode including impurity corresponding to the second conduction type; diffusing the impurity from the emitter lead-out electrode, the collector lead-out electrode, and the base lead-out electrode to form an emitter diffusion layer of the first conduction type, a collector contact diffusion layer of the first conduction type; and a base contact diffusion layer of the second conduction type; locating an end of the emitter diffusion layer and a first end of the base contact diffusion layer at positions directly below a portion of the second insulating films which extends at a side of the emitter lead-out electrode; and locating a second end of the base contact diffusion layer and an end of the collector contact diffusion layer at positions directly below a portion of the second insulating films which extends at a side of the collector lead-out electrode.

16 Claims, 19 Drawing Sheets

U.S. PATENT DOCUMENTS

| | | | |
|---|---|---|---|
| 4,693,782 | 9/1987 | Kikuchi et al. | 156/653 |
| 4,891,328 | 1/1990 | Gris | 437/31 |
| 4,902,640 | 2/1990 | Sachitano et al. | 437/162 |
| 4,908,324 | 3/1990 | Nihira et al. | 437/31 |
| 4,916,083 | 4/1990 | Monkowski et al. | 437/31 |
| 4,918,026 | 4/1990 | Kosiak et al. | 437/31 |
| 4,962,053 | 10/1990 | Spratt et al. | 437/31 |
| 4,978,630 | 12/1990 | Kim | 437/162 |
| 4,994,400 | 2/1991 | Yamaguchi et al. | 437/162 |
| 5,086,005 | 2/1992 | Hirakawa | 437/162 |
| 5,100,811 | 3/1992 | Winnerl et al. | 437/59 |
| 5,151,378 | 9/1992 | Ramde | 437/59 |

OTHER PUBLICATIONS

M. Suzuki et al, "A 165 ps/gate 5000-Gate ECL Gate Array, Extended Abstracts of the 17th Conference on Solid State Devices and Materials", Tokyo 1986, pp. 377–380.

1983 National Meeting of the Semiconductor Material Department of the Institute of Electronics and Communication Engineers of Japan, p. 247.

Sakai et al, "Prospects of SST Technology for High Speed LSI" IEDM 85, pp. 18–21.

Sakai et al, "Very High Speed Bipolar LSI Process Technology: SST", Review of the Electrical Communications Laboratories, vol. 35, No. 4, 1987.

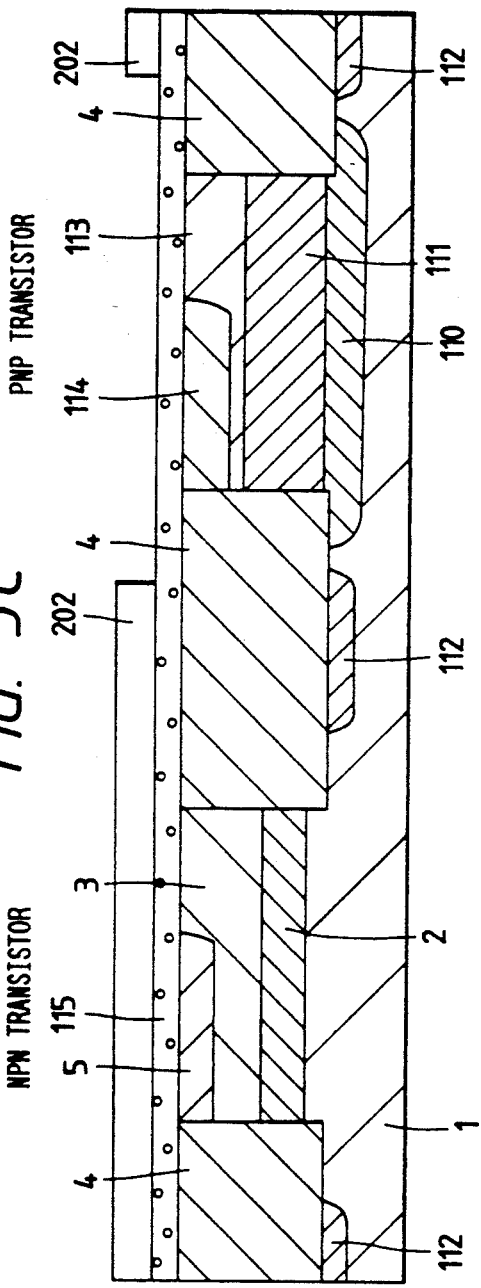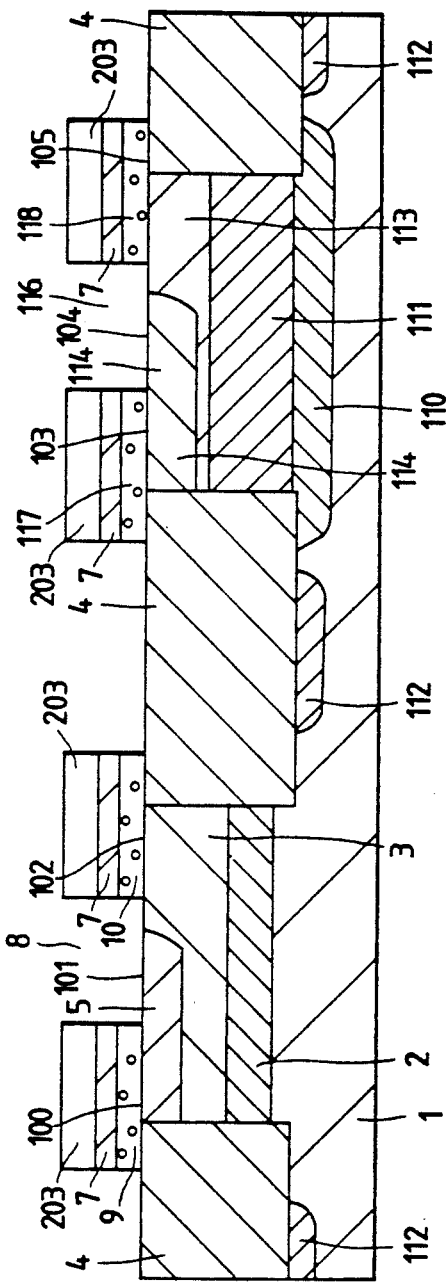

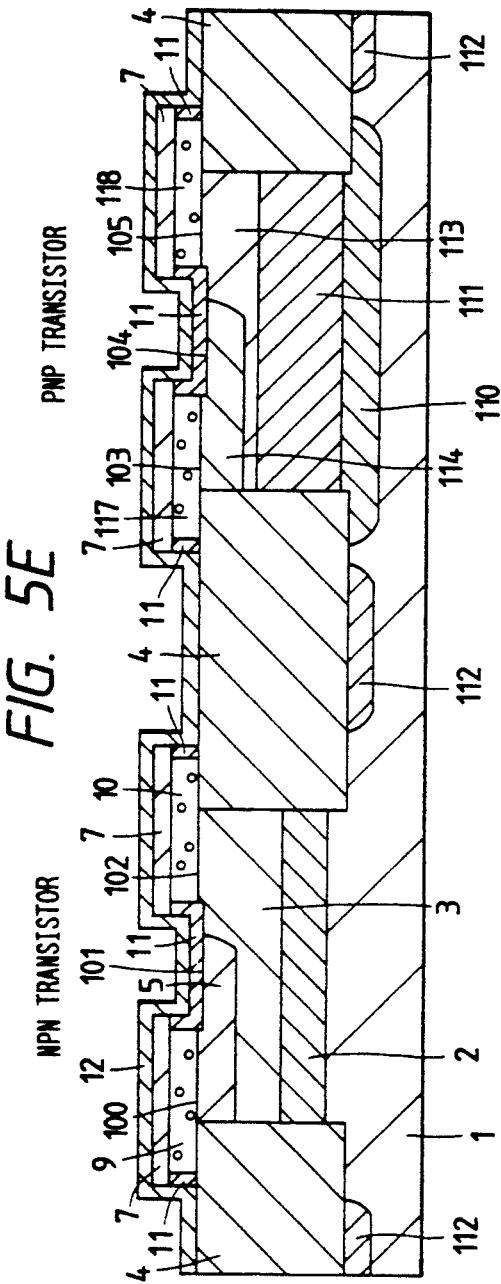

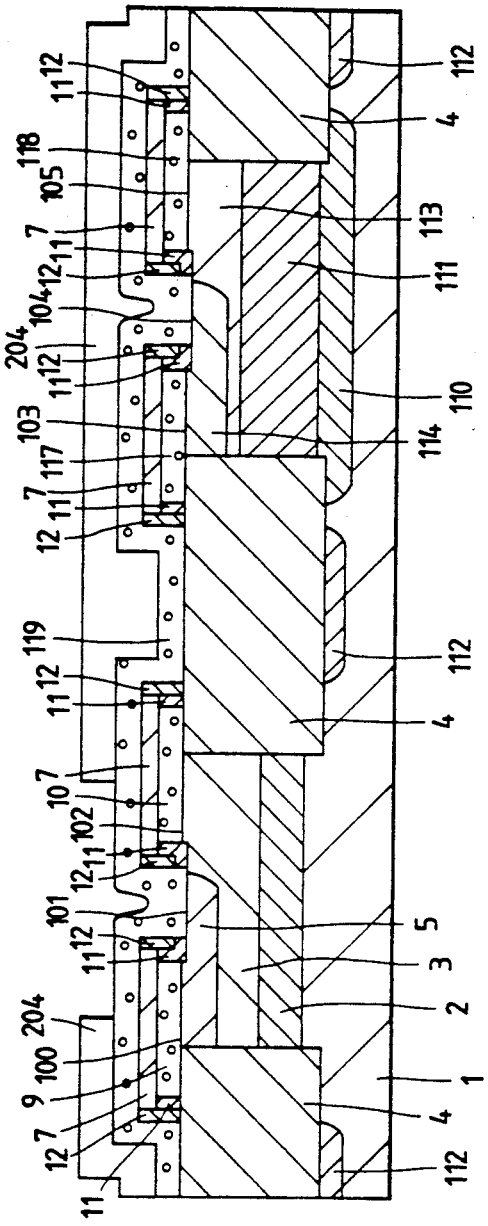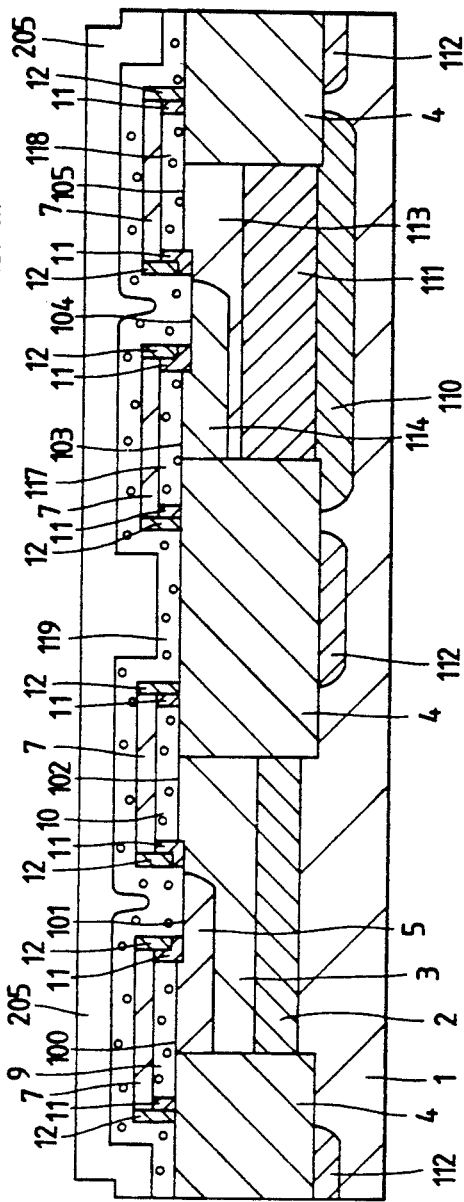

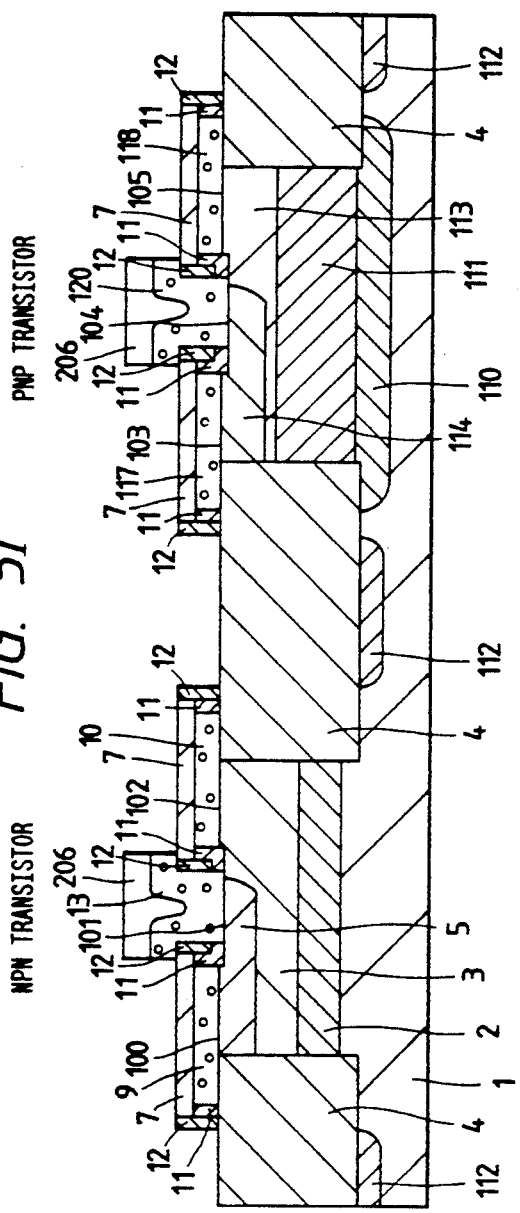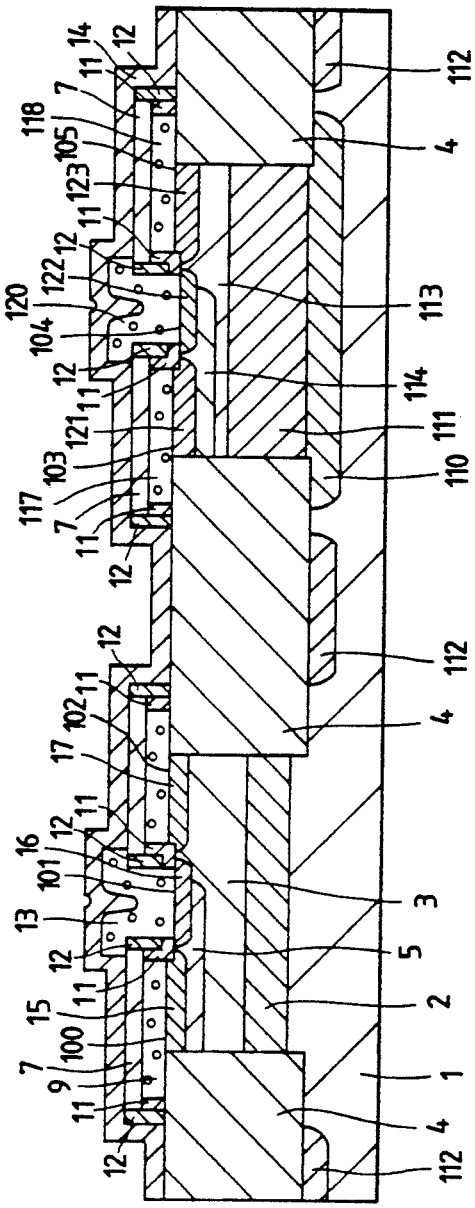

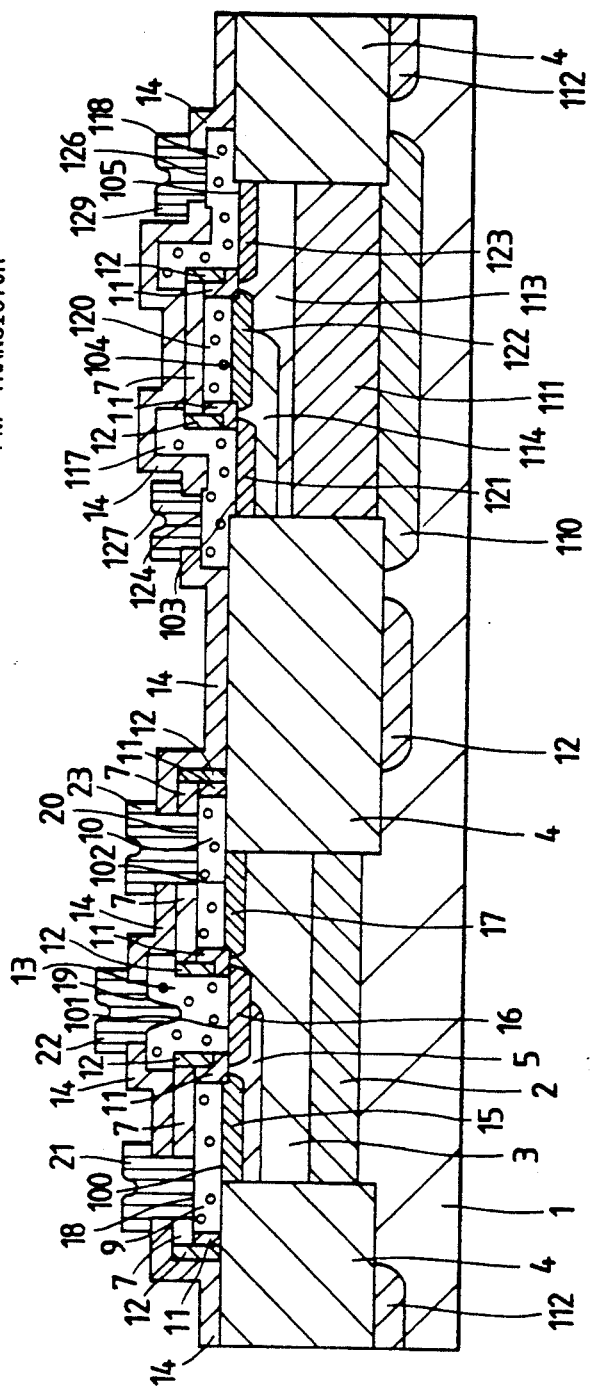

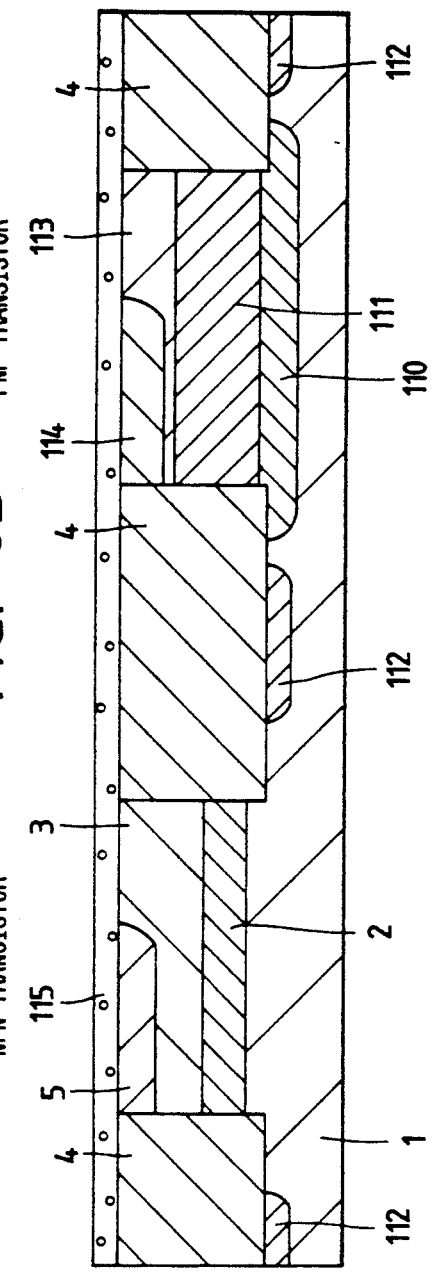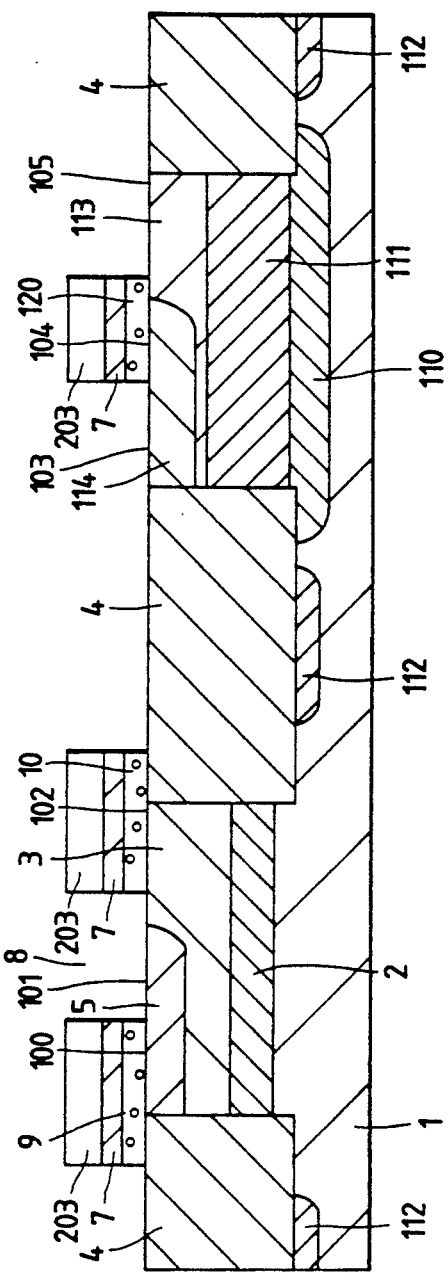

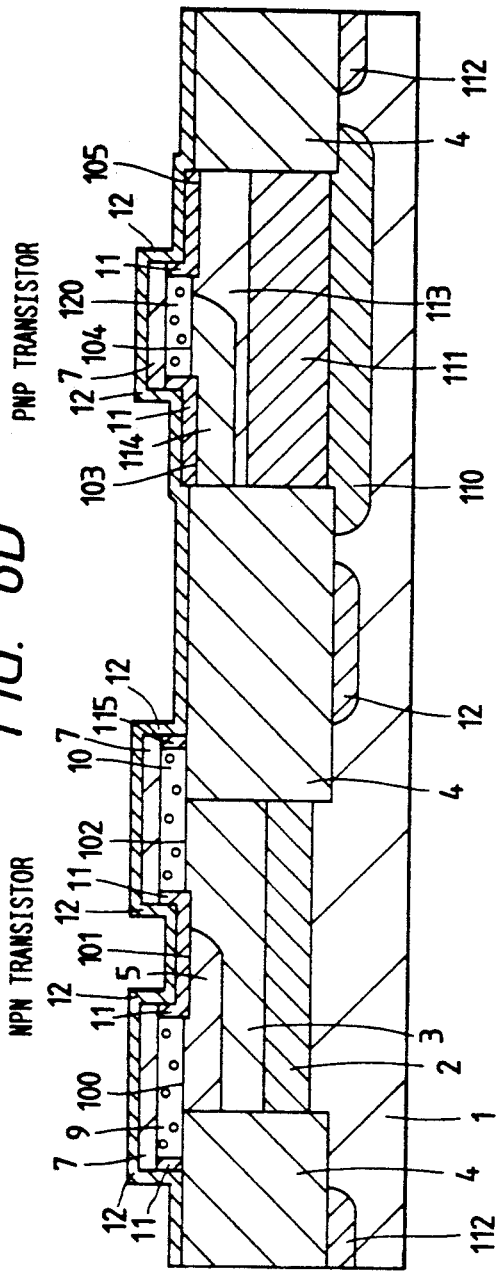

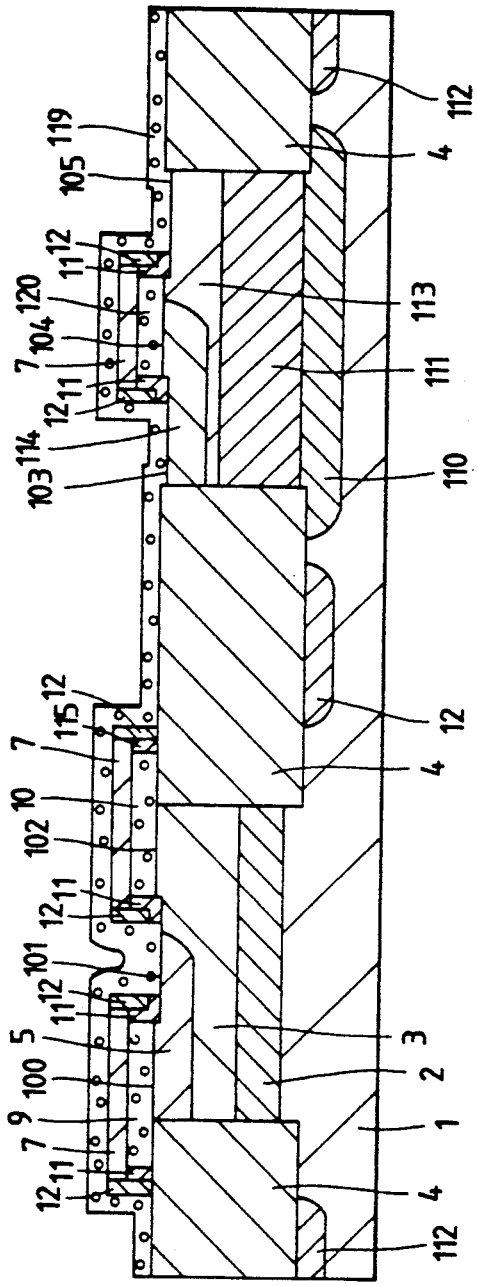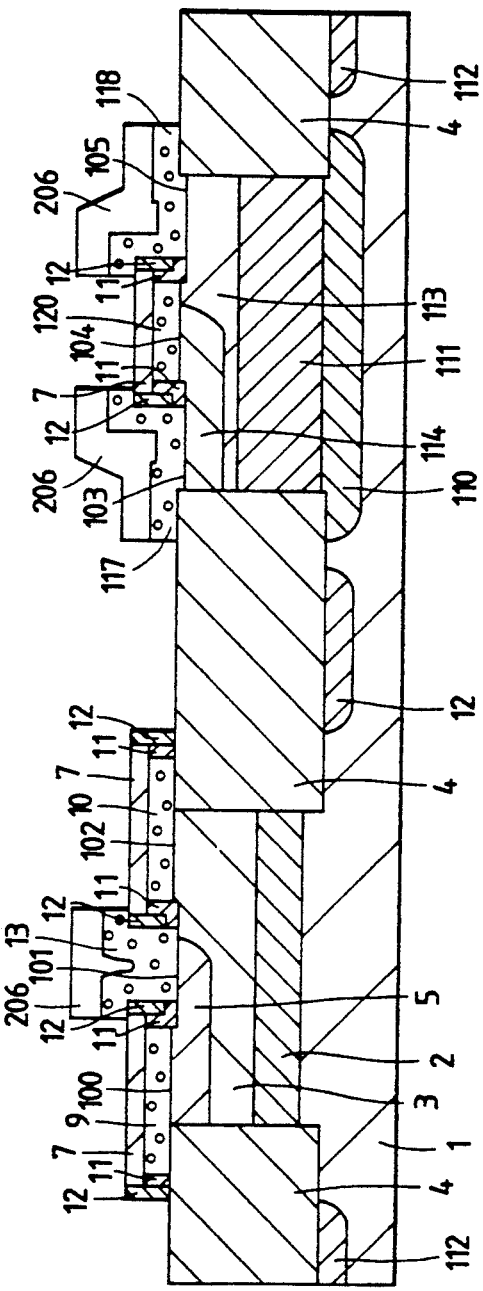

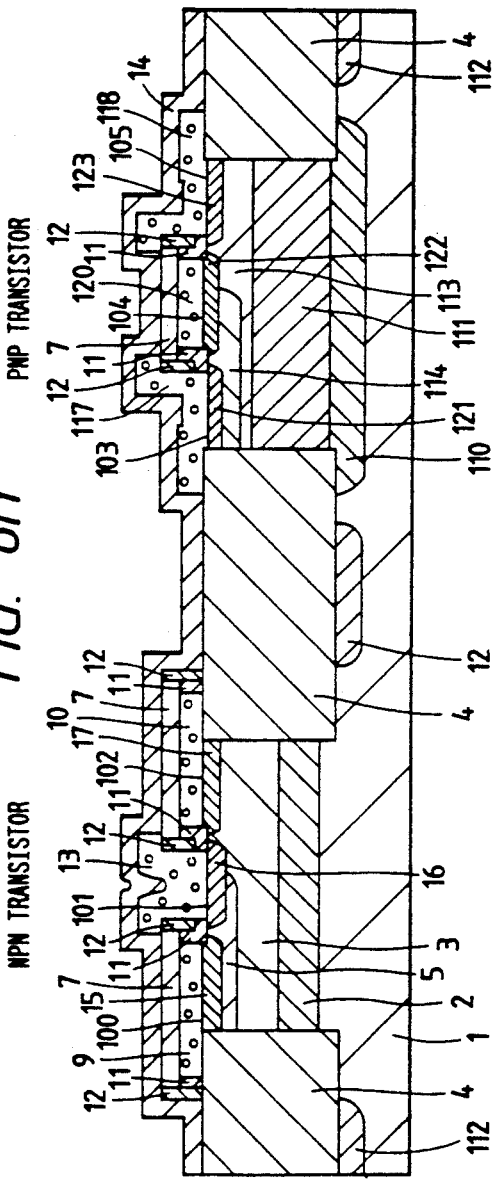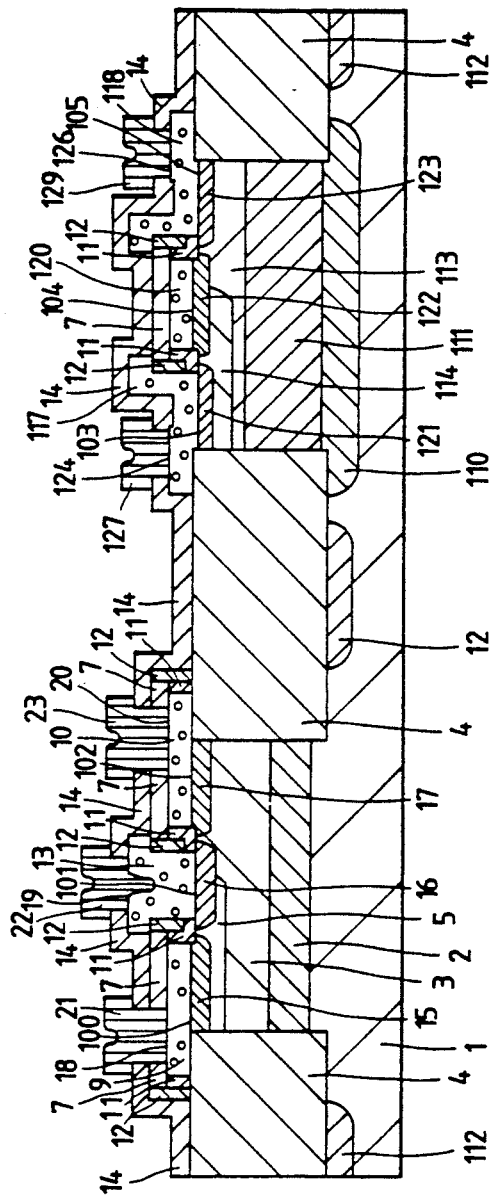

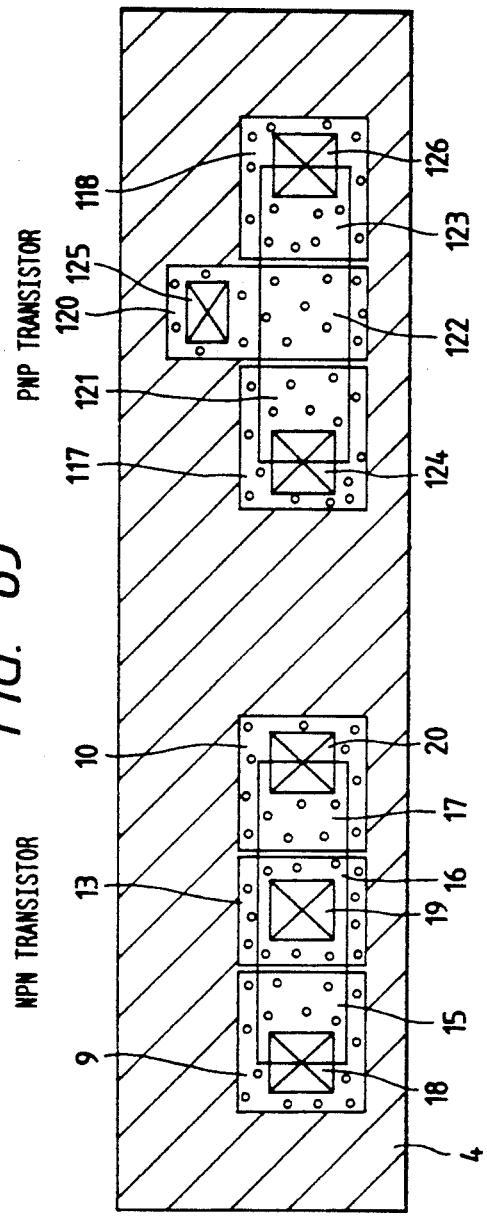
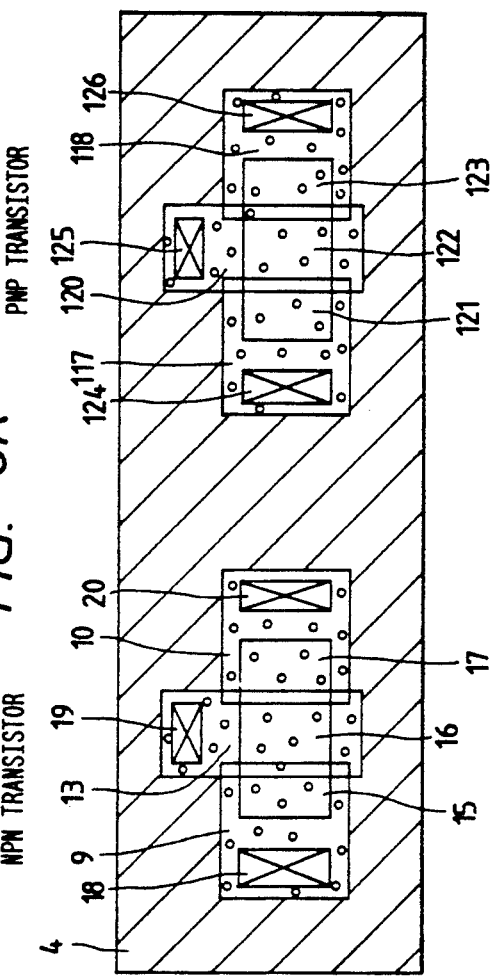

METHOD OF FABRICATING SEMICONDUCTOR DEVICE

CROSS-REFERENCES TO RELATED APPLICATIONS

This application is a division of, Application Ser. No. 07/750,856, filed Aug. 29, 1991 now U.S. Pat. No. 5,204,274; which is a continuation-in-part of Ser. No. 07/431,581, filed Nov. 3, 1989 now abandoned.

BACKGROUND OF THE INVENTION

1. Field of the Invention

This invention relates to a method of fabricating a semiconductor device having a self-aligned structure.

2. Description of the Prior Art

Y. Kobayashi et al. published "High Speed IC fabricated by SST4 process" in the 1986 National Meeting of the Institute of Electronics and Communication Engineers of Japan. This publication relates to an improvement of an SST (super self-aligned process technology) structure. Specifically, the improved SST structure additionally has a collector compensation layer. According to this publication, in a fabricated transistor, an emitter width was equal to 0.35 μm and the distance between a collector and an emitter was equal to 0.65 μm, and the distance between the emitter and a base was also equal to 0.65 μm.

M. Suzuki et al. published "A 165 ps/gate 5000-Gate ECL Gate Array" in Extended Abstracts of the 17th Conference on Solid State Devices and Materials, Tokyo, 1985, pp. 377-380. According to this publication, a 5130-gate ECL gate array has been developed with a basic gate delay of 164 ps/gate at a power dissipation of 1.5 mW/gate. This gate array is fabricated by using 1.5 μm rule super self-aligned process technology (SST-1A) combined with deep U-groove isolation and three-level metallization technology. This device permits the customization of a dual 40-bit data link control LSI equivaling 3654 gates for the multiprocessing system. The power dissipation of this LSI is 4.8 W/chip.

U.S. Pat. No. 4,693,782 discloses a method of fabricating a semiconductor device having the structure of self-alignment between an emitter contact and a base contact.

U.S. Pat. No. 4,908,324 discloses a method of manufacturing a bipolar transistor having the structure of self-alignment between an emitter contact and a base contact.

FIG. 1 shows a transistor with the base and the emitter formed by a self-aligned process which is published in the 1983 National Meeting of the Semiconductor Material Department of the Institute of Electronics and Communication Engineers of Japan.

As shown in FIG. 1, the prior art transistor includes a p-type semiconductor substrate 1, an n-type buried layer 2, an n-type epitaxial layer 3, an isolating region 4 consistinf of an SiO₂ film, a base diffusion layer 5, an emitter lead-out electrode 9 consisting of a polycrystalline silicon film containing arsenic, a collector lead-out electrode 10 consisting of a polycrystalline silicon film containing arsenic, a base lead-out electrode 13 consisting of a polycrystalline silicon film containing boron, an emitter diffusion layer 15, a base contact diffusion layer 16, a collector contact diffusion layer 17, electrode leads 21-23 of aluminum or the like, SiO₂ films 50, 52, and 53, an Si₃N₄ film 51, and an emitter contact 100.

In the prior art transistor of FIG. 1, the base and the emitter are formed by a self-aligned process. During the self-aligned process, the base electrode 13 is formed, and then an SiO₂ film is formed. The SiO₂ film is subjected to an anisotropic dry etching process to leave the SiO₂ film 53 on a side surface of the base electrode 13. In addition, an opening for the emitter contact 100 is provided in the SiO₂ film. The self-aligned process enables smaller emitter and base, thus reducing the emitter-base capacitance, the base-collector capacitance, and the base resistance. The reductions of these parameters result in a higher operation speed of the transistor.

SUMMARY OF THE INVENTION

It is an object of this invention to provide an improved method of fabricating a semiconductor device.

A first aspect of this invention provides a method of fabricating a semiconductor device, comprising the steps of forming a base diffusion layer in a predetermined region in a semiconductor substrate of a first conduction type, the base diffusion layer being of a second conduction type; forming first insulating films and simultaneously forming an emitter lead-out electrode and a collector lead-out electrode in regions above an emitter-contact-forming region and a collector-contact-forming region, the first insulating films extending on the emitter and collector lead-out electrodes, the emitter and collector lead-out electrodes including impurity corresponding to the first conduction type; forming second insulating films at sides of the emitter and collector lead-out electrodes; forming a base contact; forming a base lead-out electrode including impurity corresponding to the second conduction type; diffusing the impurity from the emitter lead-out electrode, the collector lead-out electrode, and the base lead-out electrode to form an emitter diffusion layer of the first conduction type, a collector contact diffusion layer of the first conduction type, and a base contact diffusion layer of the second conduction type; locating an end of the emitter diffusion layer and a first end of the base contact diffusion layer at positions directly below a portion of the second insulating films which extends at a side of the emitter lead-out electrode; and locating a second end of the base contact diffusion layer and an end of the collector contact diffusion layer at positions directly below a portion of the second insulating films which extends at a side of the collector lead-out electrode.

A second aspect of this invention provides a method of fabricating a semiconductor device, comprising the steps of forming a base diffusion layer in a predetermined region in a semiconductor substrate of a first conduction type, the base diffusion layer being of a second conduction type; forming first insulating films and simultaneously forming an emitter lead-out electrode and a collector lead-out electrode in regions above an emitter-contact-forming region and a collector-contact-forming region, the first insulating films extending on the emitter and collector lead-out electrodes, the emitter and collector lead-out electrodes including impurity corresponding to the first conduction type; forming second insulating films at sides of the emitter and collector lead-out electrodes; forming a base contact; implanting ions corresponding to the second conduction type into a base-contact-forming region to form a base contact diffusion layer while using the first and second insulating films as masks; diffusing the impurity from the emitter lead-out electrode and the collector lead-out electrode to form an emitter diffusion layer of the first conduction type and a collector contact diffusion layer of the first conduction type; locating an end of the emitter diffusion layer and a first end of the base contact diffusion layer at positions directly below a portion of the second insulating films which extends at a side of the emitter lead-out electrode; and locating a second end of the base contact diffusion layer and an end of the collector contact diffusion layer at positions directly below a portion of the second insulating films which extends at a side of the collector lead-out electrode.

A third aspect of this invention provides a method of fabricating a semiconductor device, comprising the steps of forming a base diffusion layer in a predetermined region in a semiconductor substrate of a first conduction type, the base diffusion layer being of a second conduction type; forming first insulating films and simultaneously forming an emitter lead-out electrode and a collector lead-out electrode in regions above an emitter-contact-forming region and a collector-contact-forming region, the first insulating films extending on the emitter and collector lead-out electrodes, the emitter and collector lead-out electrodes including impurity corresponding to the first conduction type; etching a region of the semiconductor substrate, which is sandwiched between the emitter lead-out electrode and the collector lead-out electrode, to form a groove in the semiconductor substrate; forming second insulating films at sides of the emitter lead-out electrode, the collector lead-out electrode, and the groove; forming a base contact; forming a base lead-out electrode including impurity corresponding to the second conduction type; diffusing the impurity from the emitter lead-out electrode, the collector lead-out electrode, and the base lead-out electrode to form an emitter diffusion layer of the first conduction type, a collector contact diffusion layer of the first conduction type, and a base contact diffusion layer of the second conduction type; locating a bottom of the groove at a position lower than a bottom surface of the emitter diffusion layer and a bottom surface of the collector contact diffusion layer; and locating the bottom of the groove at a position higher than a bottom surface of the base diffusion layer.

A fourth aspect of this invention provides a method of fabricating a semiconductor device including an NPN transistor and a PNP transistor, comprising the steps of forming a well region in a predetermined region in a semiconductor substrate of a first conduction type, the well region being of a second conduction type; forming a base diffusion layer of the first conduction type in the well region; forming a base diffusion layer of the second conduction type in a predetermined region in the semiconductor substrate; forming a first polycrystalline silicon film on the semiconductor substrate; introducing impurity corresponding to an n-type conduction into a portion of the first polycrystalline silicon film which extends above an NPN-transistor-forming region; introducing impurity corresponding to a p-type conduction into a portion of the first polycrystalline silicon film which extends above a PNP-transistor-forming region; forming a first insulating film on the first polycrystalline silicon film; etching the first insulating film and the first polycrystalline silicon film, and simultaneously forming emitter lead-out electrodes and collector lead-out electrodes in regions above emitter-contact-forming regions and collector-contact-forming regions of the NPN transistor and the PNP transistor; forming second insulating films at sides of the emitter and collector lead-out electrodes; simultaneously forming base contacts of the NPN transistor and the PNP transistor; forming a second polycrystalline silicon film on the semiconductor substrate; introducing impurity corresponding to the p-type conduction into a portion of the second polycrystalline silicon film which extends above the NPN-transistor-forming region; introducing impurity corresponding to the n-type conduction into a portion of the second polycrystalline silicon film which extends above the PNP-transistor-forming region; etching the second polycrystalline silicon film to form a base lead-out electrode of the NPN transistor and a base lead-out electrode of the PNP transistor, wherein the base lead-out electrode of the NPN transistor includes impurity corresponding to the p-type conduction, and wherein the base lead-out electrode of the PNP transistor includes impurity corresponding to the n-type conduction; diffusing the impurity from the emitter lead-out electrode, the collector lead-out electrode, and the base lead-out electrode to form emitter diffusion layers, collector contact diffusion layers, and base contact diffusion layers of the NPN transistor and the PNP transistor; locating an end of the emitter diffusion layer and a first end of the base contact diffusion layer at positions directly below a portion of the second insulating films which extends at a side of the emitter lead-out electrode in each of the NPN transistor and the PNP transistor; and locating a second end of the base contact diffusion layer and an end of the collector contact diffusion layer at positions directly below a portion of the second insulating films which extends at a side of the collector lead-out electrode in each of the NPN transistor and the PNP transistor.

A fifth aspect of this invention provides a method of fabricating a semiconductor device including an NPN transistor and a PNP transistor, comprising the steps of forming a well region in a predetermined region in a semiconductor substrate of a first conduction type, the well region being of a second conduction type; forming a base diffusion layer of the first conduction type in the well region; forming a base diffusion layer of the second conduction type in a predetermined region in the semiconductor substrate; forming a first polycrystalline silicon film on the semiconductor substrate, the first polycrystalline silicon film including impurity corresponding to the first conduction type; forming a first insulating film on the first polycrystalline silicon film; etching the first insulating film and the first polycrystalline silicon film to form a base lead-out electrode in a region above a base-contact-forming region of the PNP transistor, and to form an emitter lead-out electrode and a collector lead-out electrode in regions above an emitter-contact-forming region and a collector-contact-forming region of the NPN transistor; forming second insulating films at sides of the base lead-out electrode of the PNP transistor, and the emitter and collector lead-out electrodes of the NPN transistor; simultaneously forming a base contact of the NPN transistor, and an emitter contact and a collector contact of the PNP transistor; forming a second polycrystalline silicon film on the semiconductor substrate; introducing impurity corresponding to the second conduction type into the second polycrystalline silicon film; etching the second polycrystalline silicon film to simultaneously form a base lead-out electrode of the NPN transistor, and an emitter lead-out electrode and a collector lead-out electrode of the PNP transistor, wherein the base lead-out electrode of the NPN transistor, and the emitter lead-out electrode and the collector lead-out electrode of the PNP transistor include impurity corresponding to the p-type conduction; diffusing the impurity from the emitter lead-out electrodes, the collector lead-out electrodes, and the base lead-out electrodes of the NPN transistor and the PNP transistor to form emitter diffusion layers, collector contact diffusion layers, and base contact diffusion layers of the NPN transistor and the PNP transistor; locating an end of the emitter diffusion layer and a first end of the base contact diffusion layer at positions directly below a portion of the second insulating films which extends at a side of the emitter lead-out electrode in each of the NPN transistor and the PNP transistor; and locating a second end of the base contact diffusion layer and an end of the collector contact diffusion layer at positions directly below a portion of the second insulating films which extends at a side of the collector lead-out electrode in each of the NPN transistor and the PNP transistor.

BRIEF DESCRIPTION OF THE DRAWINGS

FIGS. 5B-5K are diagrams showing a process flow of a semiconductor device fabricated by the method of the fourth embodiment, the drawings including sectional views of a device substrate.

FIG. 5L is a sectional view of a semiconductor device fabricated by a modification of the method of the fourth embodiment.

FIG. 6A is a sectional view of a semiconductor device fabricated by a method according to a fifth embodiment of this invention.

FIGS. 6B-6I are diagrams showing a process flow of a semiconductor device fabricated by the method of the fifth embodiment, the drawings including sectional views of a device substrate.

FIG. 6J is a sectional view of the semiconductor device fabricated by the method of the fifth embodiment.

FIG. 6K is a sectional view of a semiconductor device fabricated by a modification of the method of the fifth embodiment.

DESCRIPTION OF THE FIRST PREFERRED EMBODIMENT

Figure 1:
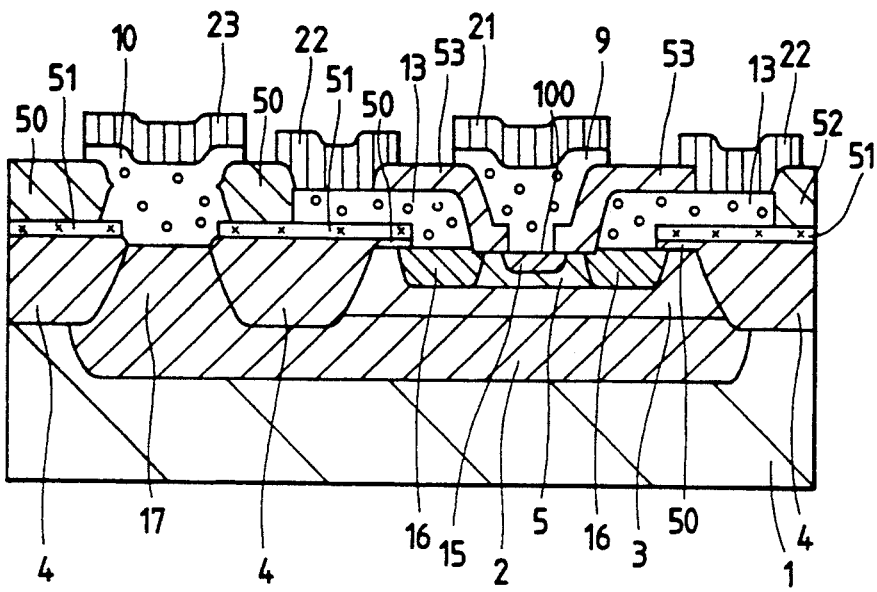
FIG. 1 is a sectional view of a prior art semiconductor device.
Figure 2A:
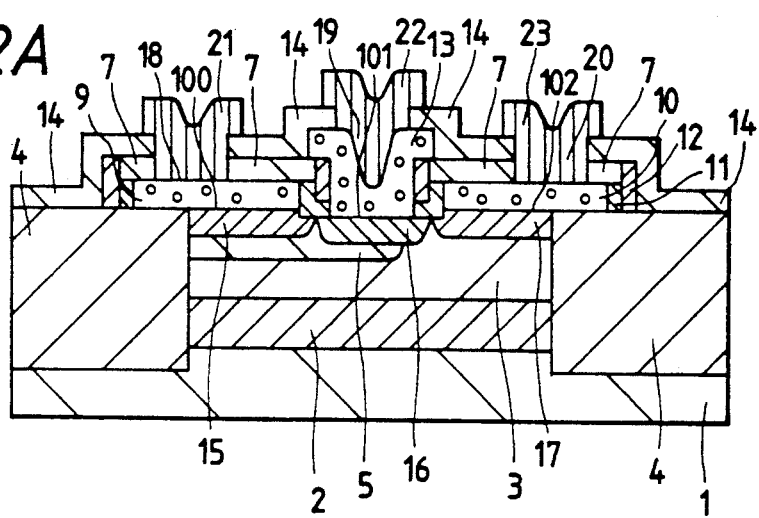
FIG. 2A is a sectional view of a semiconductor device fabricated by a method according to a first embodiment of this invention.

FIG. 2A shows a completed bipolar semiconductor device fabricated by a method according to a first embodiment of this invention.

As shown in FIG. 2A, the completed bipolar semiconductor device includes a p-type (111) semiconductor substrate 1, an n-type buried layer 2, an n-type epitaxial layer 3, an isolating region (a separating region) 4 consisting of an $SiO_2$ film, a base diffusion layer 5, $SiO_2$ films 11, 12, and 14, an emitter lead-out electrode 9 consisting of a polycrystalline silicon film containing n-type impurity (for example, arsenic or phosphorus), a collector lead-out electrode 10 consisting of a polycrystalline silicon film containing n-type impurity (for example, arsenic or phosphorus), a base lead-out electrode 13 consisting of a polycrystalline silicon film containing p-type impurity (for example, boron), an emitter diffusion layer 15, a base contact diffusion layer 16, a collector contact diffusion layer 17, an emitter contact window 18, a base contact window 19, a collector contact window 20, electrode leads 21-23 of aluminum or the like, an emitter contact 100, a base contact 101, and a collector contact 102.

The method of fabricating the bipolar semiconductor device of FIG. 2A will now be described with reference to FIGS. 2B-2H. A p-type (111) semiconductor substrate 1 having a resistivity of 10-20 $\Omega$.cm is masked by a resist of a predetermined pattern. Arsenic ions are implanted into the substrate 1 with the mask to form an n-type buried layer 2. During the arsenic ion implantation, the acceleration energy (the implanting energy) is 60 keV. The implanted quantity of arsenic ions is $1 \times 10^{15}/cm^2$. Then, an n-type epitaxial layer 3 is formed on the n-type buried layer 2. The n-type epitaxial layer 3 has a resistivity of 0.6 $\Omega$.cm and a thickness of about 1 $\mu$m. Next, an isolating region 4 is formed by, for example, a box isolation process. Silicon on the surface of an island region surrounded by the isolating region 4 is exposed. After the epitaxial layer 3 is masked by a resist of a predetermined pattern, boron ions are implanted into the epitaxial layer 3 with the mask to form a base diffusion layer 5. During the boron ion implantation, the acceleration energy (the implanting energy) is 20 keV. The implanted quantity of boron ions is $1.5 \times 10^{13}/cm^2$.

It should be noted that the following alternative process may be used in the formation of the base diffusion layer 5. A thin $SiO_2$ film is formed on the surface of the island region, and boron ions are implanted into the epitaxial layer 3 via the thin $SiO_2$ film to form a base diffusion layer 5. Then, the thin $SiO_2$ film is removed.

Figure 2B:
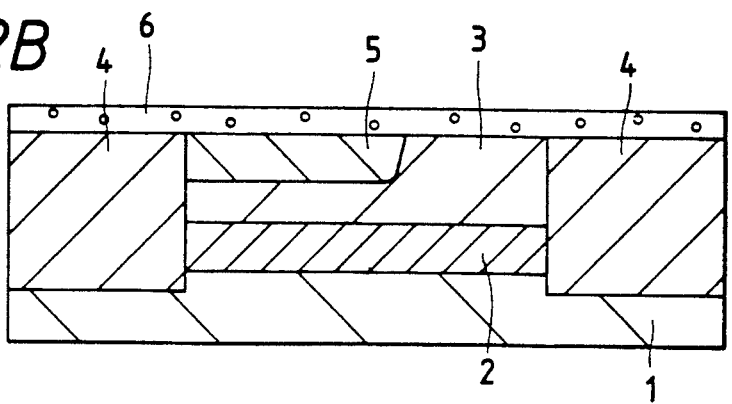
FIGS. 2B-2G are diagrams showing a process flow of a semiconductor device fabricated by the method of the first embodiment, the drawings including sectional views of a device substrate.
Figure 2C:
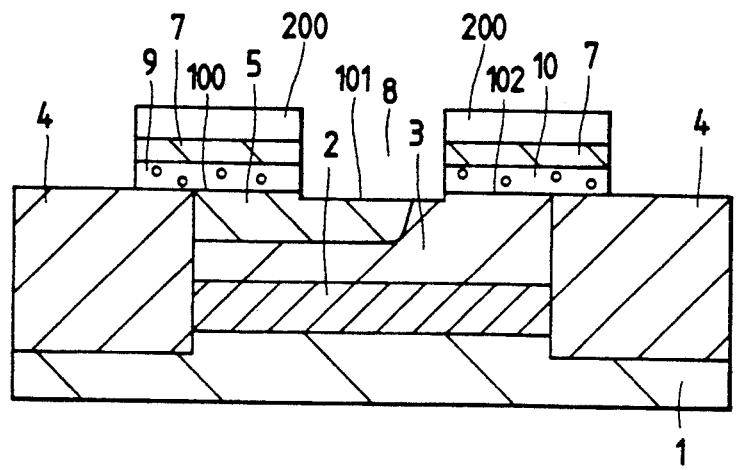

After the mask resist is removed, a polycrystalline silicon film 6 is deposited on the semiconductor body by, for example, a reduced-pressure CVD process (see FIG. 2B). The polycrystalline silicon film 6 has a thickness of about 3,000 Å, and contains n-type impurity (for example, arsenic or phosphorus).

It should be noted that the following alternative process may be used in the formation of the polycrystalline silicon film 6. After a non-doped polycrystalline silicon film is deposited on the semiconductor body, arsenic ions are implanted into the non-doped polycrystalline silicon film. During the arsenic ion implantation, the acceleration energy (the implanting energy) is 60 keV. The implanted quantity of arsenic ions is $1\times10^{16}/cm^2$.

Then, an $SiO_2$ film 7 is deposited on the semiconductor body by, for example, a CVD process. The $SiO_2$ film 7 has a thickness of about 2,500 Å. The $SiO_2$ film 7 is masked by a resist 200 of a predetermined pattern. The semiconductor body with the mask is subjected to an anisotropic dry etching process so that the $SiO_2$ film 7 and the polycrystalline silicon film 6 are removed from a region for a base contact 101 to form an opening 8. At the same time, a polycrystalline silicon film pattern for an emitter lead-out electrode 9 and a collector lead-out electrode 10 is formed by remaining portions of the polycrystalline film 6 (see FIG. 2C). Thereby, an emitter contact 100, a base contact 101, and a collector contact 102 can be formed in a self-aligned manner.

After the resist 200 is removed, the semiconductor body is subjected to an oxidization process to form an $SiO_2$ film 11. The oxidization process is executed at 900° C. for about 30 minutes. The $SiO_2$ film 11 has a thickness of about 500 Å. Then, an $SiO_2$ film 12 is deposited on the semiconductor body by, for example, a CVD process. The $SiO_2$ film 12 has a thickness of about 2,000 Å (see FIG. 2D).

The semiconductor body with the $SiO_2$ films 11 and 12 is subjected to an anisotropic dry etching process to leave only parts of the $SiO_2$ films 11 and 12 which extend at sides of the polycrystalline films for the emitter lead-out electrode 9 and the collector lead-out electrode 10. Subsequently, a polycrystalline silicon film is deposited on the semiconductor body by, for example, a reduced-pressure CVD process. This polycrystalline silicon film has a thickness of about 3,000 Å, and contains p-type impurity such as boron. The polycrystalline silicon film is masked by a resist 206 of a predetermined pattern, and the polycrystalline silicon film with the mask is exposed to an etching process to form the base lead-out electrode 13 (see FIG. 2E).

It should be noted that the following alternative process may be used in the formation of the polycrystalline silicon film. After a non-doped polycrystalline silicon film is deposited on the semiconductor body, boron ions are implanted into the non-doped polycrystalline silicon film. During the boron ion implantation, the acceleration energy (the implanting energy) is 30 keV. The implanted quantity of boron ions is $1\times10^{15}/cm^2$.

After the resist 206 is removed, an $SiO_2$ film 14 is deposited on the semiconductor body by, for example, a CVD process. The $SiO_2$ film 14 has a thickness of about 2,000 Å. Then, the semiconductor body with the $SiO_2$ film 14 is subjected to a thermal treatment at 950° C. for about 40 minutes so that n-type impurity is diffused from the n-type polycrystalline silicon films for the emitter lead-out electrode 9 and the collector lead-out electrode 10 to form an emitter diffusion layer 15 and a collector contact diffusion layer 17, and that p-type impurity is diffused from the p-type polycrystalline silicon film for the base lead-out electrode 13 to form a base contact diffusion layer 16. The diffusion process is designed so that an emitter-base junction and a base-collector junction will be located below the $SiO_2$ films 11 and 12 which extend at the sides of the polycrystalline silicon films for the emitter lead-out electrode 9 and the collector lead-out electrode 10 (see FIG. 2F). Specifically, opposing ends of the emitter diffusion layer 15 and the base contact diffusion layer 16 are located directly below the portions of the $SiO_2$ films 11 and 12 which extend between the emitter lead-out electrode 9 and the base lead-out electrode 13. In addition, opposing ends of the collector contact diffusion layer 17 and the base contact diffusion layer 16 are located directly below the portions of the $SiO_2$ films 11 and 12 which extend between the collector lead-out electrode 10 and the base lead-out electrode 13.

For a high junction breakdown voltage, it is preferable to optimize the thickness of the $SiO_2$ film 12 and the conditions of the thermal treatment to prevent the emitter diffusion layer 15, the collector contact diffusion layer 17, and the base contact diffusion layer 16 from directly contacting with each other.

It should be noted that the following alternative process may be used in the formation of the emitter diffusion layer 15, the base contact diffusion layer 16, and the collector contact diffusion layer 17. Before a p-type-impurity doped polycrystalline silicon film for the base lead-out electrode 13 is deposited on the semiconductor body, the semiconductor body is subjected to a thermal treatment at 950° C. for about 40 minutes to form the emitter diffusion layer 15 and the collector contact diffusion layer 17. Then, the base lead-out electrode 13 is formed. Subsequently, the semiconductor body is subjected to a thermal treatment at 900° C. for about 30 minutes to form the base contact diffusion layer 16. In this alternative process, the step of diffusing p-type impurity is executed at the final stage. The alternative process is used in view of the fact that p-type impurity has a large diffusion coefficient.

Subsequently, an emitter contact window 18, a base contact window 19, and a collector contact window 20 are formed in the $SiO_2$ films 7 and 14. Then, electrode leads 21, 22, and 23 of aluminum or the like are formed which extend into the emitter contact window 18, the base contact window 19, and the collector contact window 20 respectively. As a result, the bipolar semiconductor device is completed (see FIG. 2G).

In summary, the emitter lead-out electrode and the collector lead-out electrode are simultaneously formed form an impurity-doped polycrystalline silicon film. The region surrounded by the polycrystalline silicon films composing the emitter lead-out electrode and the collector lead-out electrode is used as a base contact region. Insulating films formed on side and upper surfaces of the polycrystalline silicon films provide insulation between the emitter lead-out electrode, the collector lead-out electrode, and the base lead-out electrode. Thereby, the base contact, the emitter contact, and the collector contact are formed in a self-aligned manner. Thus, it is possible to fabricate a semiconductor device having a small semiconductor-element size, a small emitter-base capacitance, a small base-emitter capacitance, a small base resistance, a small collector-substrate capacitance, and a small collector resistance. These small parameters of the semiconductor device enables a high speed operation of the semiconductor device.

Figure 2D:
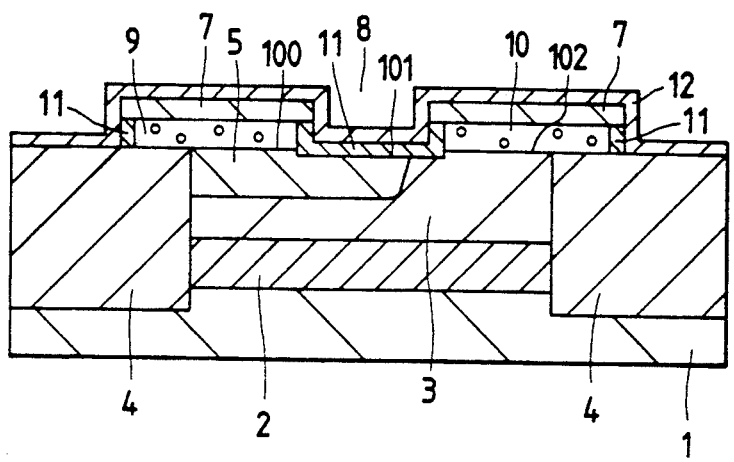
Figure 2E:
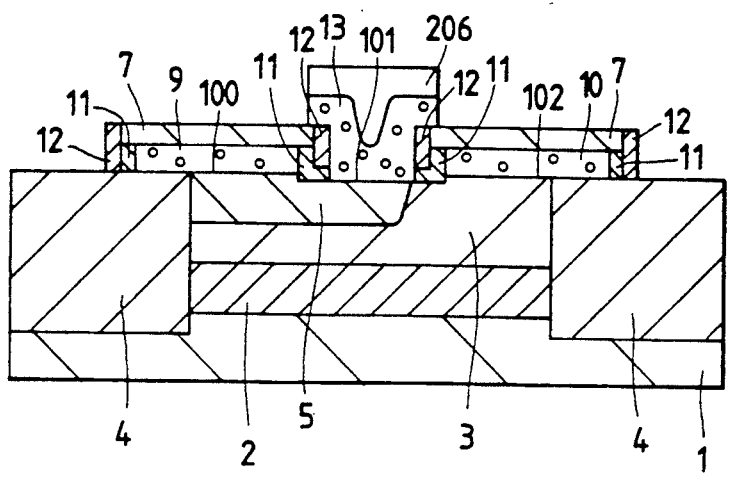
Figure 2F:
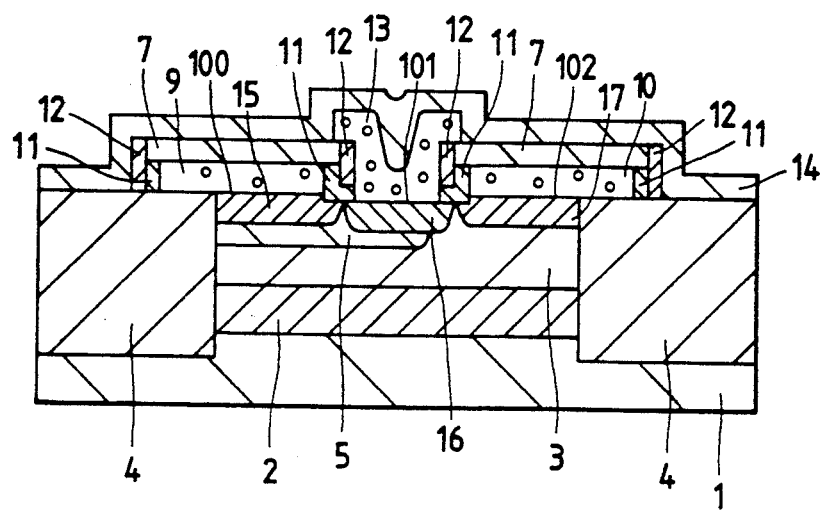
Figure 2G:
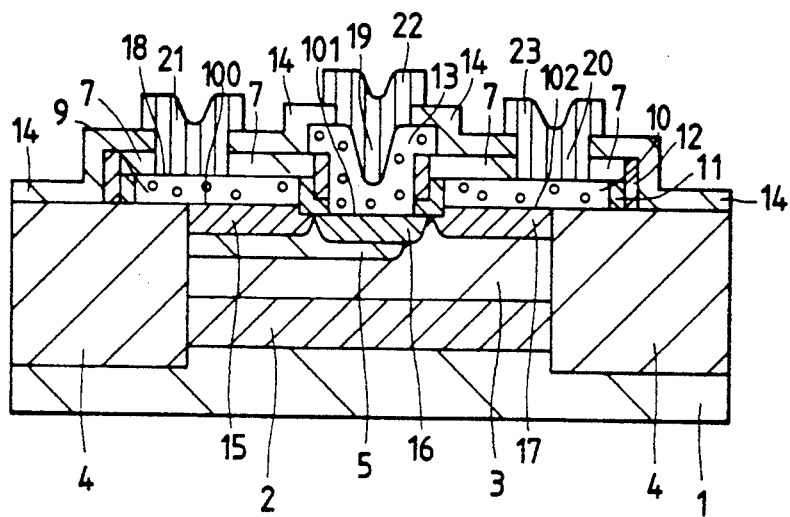
Figure 2H:
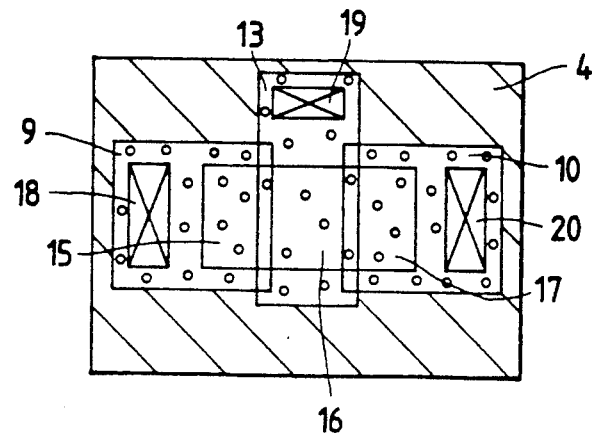
FIG. 2H is a sectional view of a semiconductor device fabricated by a modification of the method of the first embodiment.

FIG. 2H shows a modification of this embodiment. In this modification, contact windows 18, 19, and 20 are formed on the isolating oxide film. This modification enables a smaller semiconductor-element size.

DESCRIPTION OF THE SECOND PREFERRED EMBODIMENT

Figure 3A:
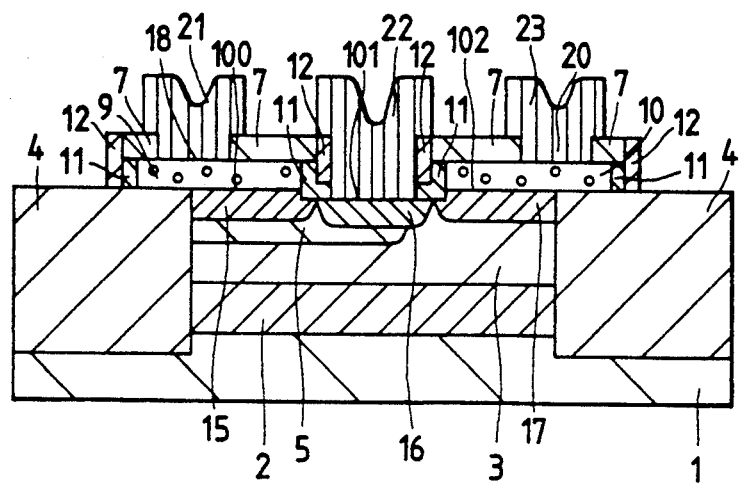
FIG. 3A is a sectional view of a semiconductor device fabricated by a method according to a second embodiment of this invention.

A second embodiment of this invention is similar to the embodiment of FIGS. 2A-2G except for design changes indicated later. FIG. 3A shows a completed bipolar semiconductor device fabricated by a method according to the second embodiment. The method of the second embodiment has steps similar to the steps related to FIGS. 2B-2D, and also has subsequent steps described hereinafter.

Figure 3B:
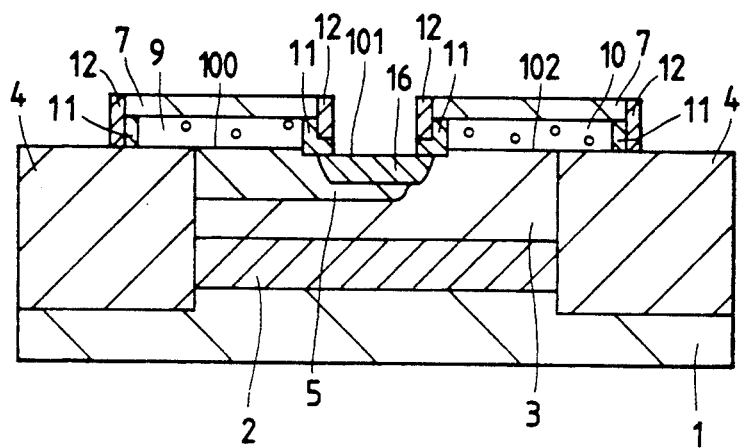
FIGS. 3B-3D are diagrams showing a process flow of a semiconductor device fabricated by the method of the second embodiment, the drawings including sectional views of a device substrate.

In the second embodiment, after a step similar to the step related to FIG. 2D, the semiconductor body with the $SiO_2$ films 11 and 12 is subjected to an anisotropic dry etching process to leave only parts of the $SiO_2$ films 11 and 12 which extend at sides of the polycrystalline films for the emitter lead-out electrode 9 and the collector lead-out electrode 10. Subsequently, $BF_2$ ions are implanted into a region of the semiconductor body which will form a base contact 101. The $BF_2$ ion implantation results in a base contact diffusion layer 16 (see FIG. 3B). During the $BF_2$ ion implantation, the $SiO_2$ film 7 is used as a mask. In addition, during the $BF_2$ ion implantation, the acceleration energy (the implanting energy) is 30 KeV. The implanted quantity of $BF_2$ ions is $1 \times 10^{15}/cm^2$.

Figure 3C:
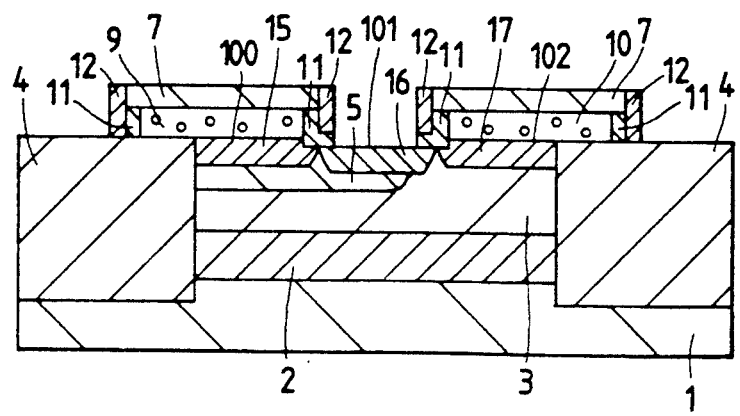

Then, the semiconductor body is subjected to a thermal treatment at 950° C. for about 40 minutes so that n-type impurity is diffused from the n-type polycrystalline silicon films for the emitter lead-out electrode 9 and the collector lead-out electrode 10 to form an emitter diffusion layer 15 and a collector contact diffusion layer 17. The diffusion process is designed so that an emitter-base junction and a base-collector junction will be located below the $SiO_2$ films 11 and 12 which extend at the sides of the polycrystalline silicon films for the emitter lead-out electrode 9 and the collector lead-out electrode 10 (see FIG. 3C).

For a high junction breakdown voltage, it is preferable to optimize the thickness of the $SiO_2$ film 12 and the conditions of the thermal treatment to prevent the emitter diffusion layer 15, the collector contact diffusion layer 17, and the base contact diffusion layer 16 from directly contacting with each other.

It should be noted that the following alternative process may be used in the formation of the emitter diffusion layer 15, the base contact diffusion layer 16, and the collector contact diffusion layer 17. Before $BF_2$ ions are implanted into a region of the semiconductor body which will form a base contact 101, the semiconductor body is subjected to a thermal treatment at 950° C. for about 40 minutes to form the emitter diffusion layer 15 and the collector contact diffusion layer 17. Then, the $BF_2$ ion implantation is executed, and the semiconductor body is subjected to a thermal treatment at 900° C. for about 30 minutes to form the base contact diffusion layer 16. In this alternative process, the step of diffusing p-type impurity is executed at the final stage. The alternative process is used in view of the fact that p-type impurity has a large diffusion coefficient.

Figure 3D:
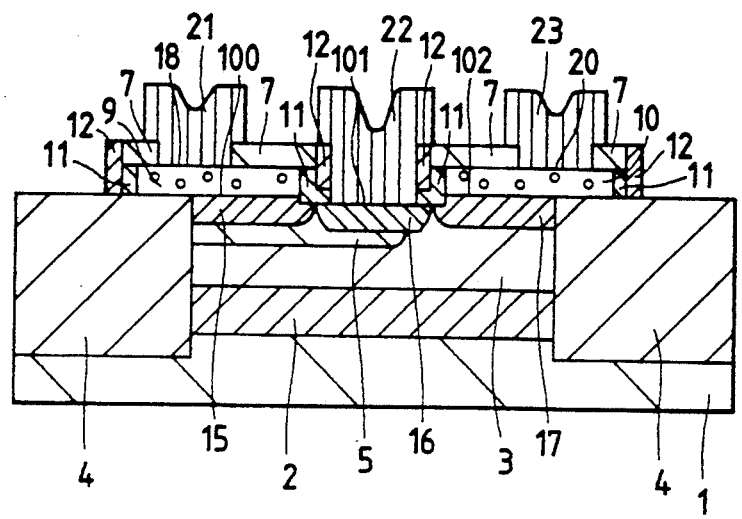

Subsequently, an emitter contact window 18, a base contact window 19, and a collector contact window 20 are formed in the $SiO_2$ film 7. Then, electrode leads 21, 22, and 23 of aluminum or the like are formed which extend into the emitter contact window 18, the base contact window 19, and the collector contact window 20 respectively. As a result, the bipolar semiconductor device is completed (see FIG. 3D).

In summary, the base contact, the emitter contact, and the collector contact are formed in a self-aligned manner. Thus, it is possible to fabricate a semiconductor device having a small semiconductor-element size, a small emitter-base capacitance, a small base-emitter capacitance, a small base resistance, a small collector-substrate capacitance, and a small collector resistance. These small parameters of the semiconductor device enables a high speed operation of the semiconductor device. In addition, since the base contact and the electrode lead are directly connected, it is possible to reduce the number of steps of the fabrication method.

DESCRIPTION OF THE THIRD PREFERRED EMBODIMENT

Figure 4A:
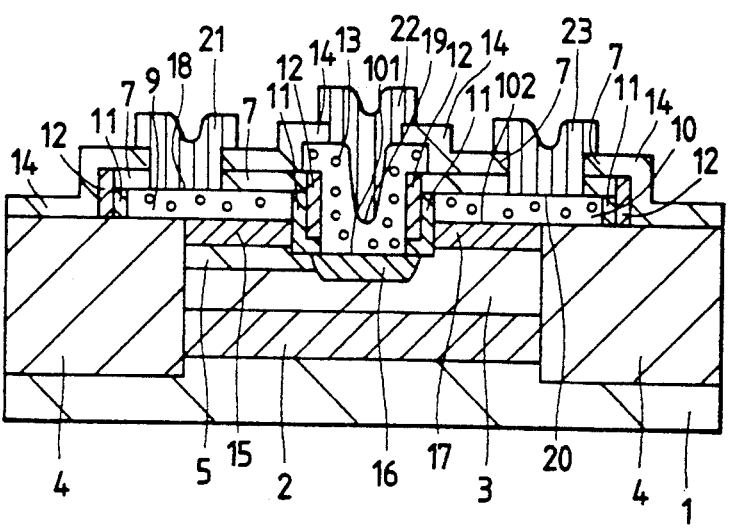
FIG. 4A is a sectional view of a semiconductor device fabricated by a method according to a third embodiment of this invention.

A third embodiment of this invention is similar to the embodiment of FIGS. 2A-2G except for design changes indicated later. FIG. 4A shows a completed bipolar semiconductor device fabricated by a method according to the third embodiment. The method of the third embodiment has steps similar to the steps related to FIG. 2B, and also has subsequent steps described hereinafter.

Figure 4B:
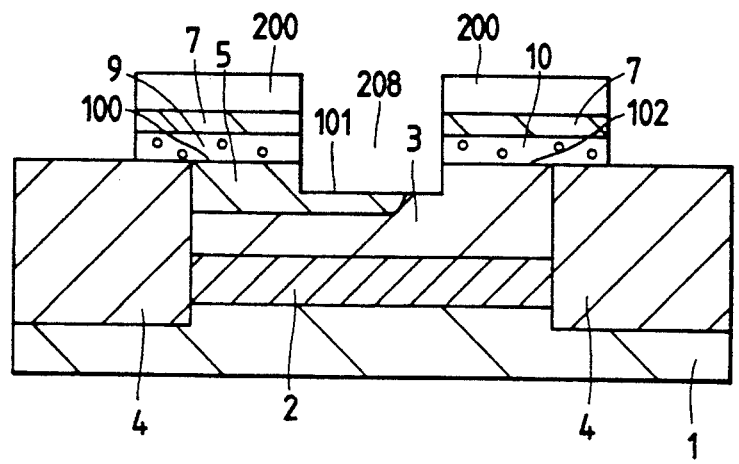
FIGS. 4B-4F are diagrams showing a process flow of a semiconductor device fabricated by the method of the third embodiment, the drawings including sectional views of a device substrate.

In the third embodiment, after a step similar to the step related to FIG. 2B, an $SiO_2$ film 7 is deposited on the semiconductor body by, for example, a CVD process. The $SiO_2$ film 7 has a thickness of about 2,500 Å. The $SiO_2$ film 7 is masked by a resist 200 of a predetermined pattern. The semiconductor body with the mask is subjected to an anisotropic dry etching process so that the $SiO_2$ film 7, the polycrystalline silicon film 6, and the n-type epitaxial layer 3 are removed from a region for a base contact 101 to form an opening or a groove 208. At the same time, a polycrystalline silicon film pattern for an emitter lead-out electrode 9 and a collector lead-out electrode 10 is formed by remaining portions of the polycrystalline silicon film 6 (see FIG. 4B). Thereby, an emitter contact 100, a base contact 101, and a collector contact 102 can be formed in a self-aligned manner. The etching process on the n-type epitaxial layer 3 is designed so that the bottom of the groove 208 will be located above the bottom of the base diffusion layer 5.

Figure 4C:
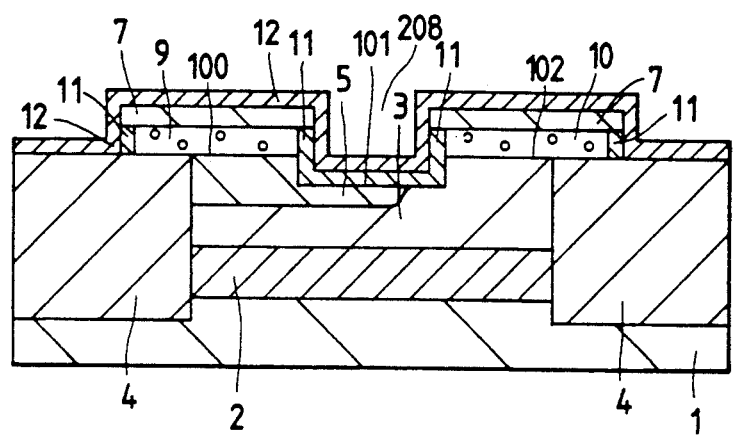

After the resist 200 is removed, the semiconductor body is subjected to an oxidation process to form an $SiO_2$ film 11. The oxidation process is executed at 900° C. for about 30 minutes. The $SiO_2$ film 11 has a thickness of about 500 Å. Then, an $SiO_2$ film 12 is deposited on the semiconductor body by, for example, a CVD process. The $SiO_2$ film 12 has a thickness of about 2,000 Å (see FIG. 4C).

Figure 4D:
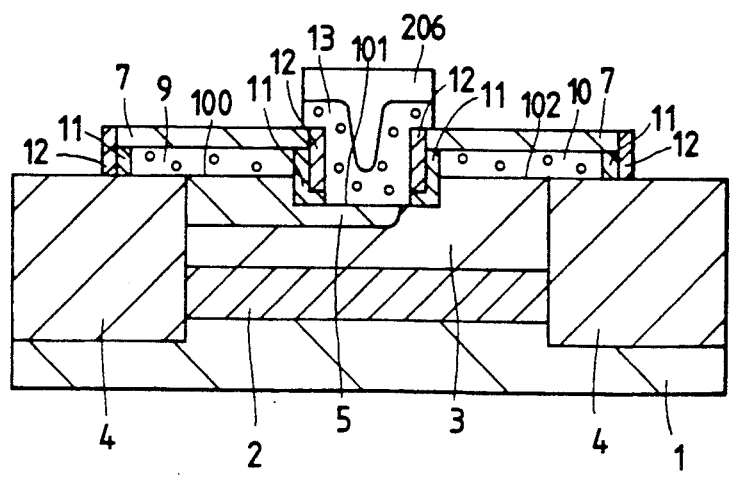

The semiconductor body with the $SiO_2$ films 11 and 12 is subjected to an anisotropic dry etching process to leave only parts of the $SiO_2$ films 11 and 12 which extend at sides of the polycrystalline films for the emitter lead-out electrode 9 and the collector lead-out electrode 10, and which extend at sides of the groove 208. Subsequently, a polycrystalline silicon film is deposited on the semiconductor body by, for example, a CVD process. This polycrystalline silicon film has a thickness of about 3,000 Å, and contains p-type impurity such as boron. The polycrystalline silicon film is masked by a resist 206 of a predetermined pattern, and the polycrystalline silicon film with the mask is exposed to an etching process to form the base lead-out electrode 13 (see FIG. 4D).

It should be noted that the following alternative process may be used in the formation of the polycrystalline silicon film. After a non-doped polycrystalline silicon film is deposited on the semiconductor body, boron ions are implanted into the non-doped polycrystalline silicon film. During the boron ion implantation, the acceleration energy (the implanting energy) is 30 keV. The implanted quantity of boron ions is $1 \times 10^{15}/cm^2$.

Figure 4E:
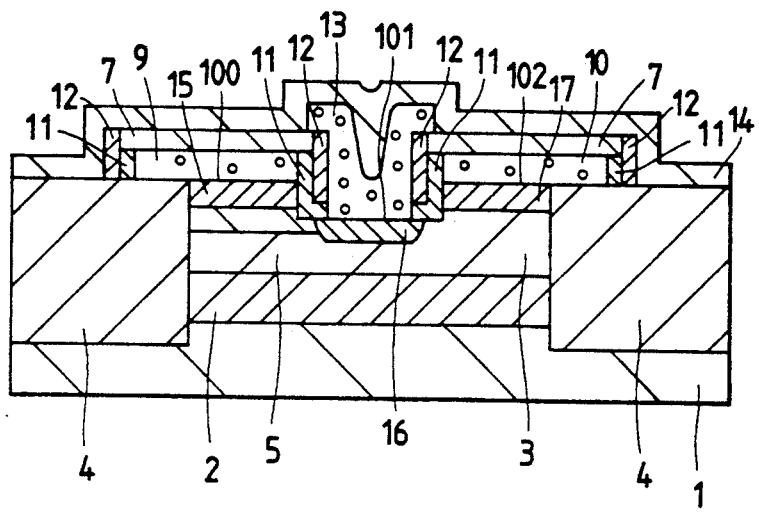

After the resist 206 is removed, an SiO$_2$ film 14 is deposited on the semiconductor body by, for example, a CVD process. The SiO$_2$ film 14 has a thickness of about 2,000 Å. Then, the semiconductor body with the SiO$_2$ film 14 is subjected to a thermal treatment at 950° C. for about 40 minutes so that n-type impurity is diffused from the n-type polycrystalline silicon films for the emitter lead-out electrode 9 and the collector lead-out electrode 10 to form an emitter diffusion layer 15 and a collector contact diffusion layer 17, and that p-type impurity is diffused from the p-type polycrystalline silicon film for the base lead-out electrode 13 to form a base contact diffusion layer 16. The diffusion process is designed so that the bottom surfaces of the emitter diffusion layer 15 and the collector contact diffusion layer 17 will be located at positions higher than the position of the upper surface of the base contact diffusion layer 16, and that sides of the emitter diffusion layer 15 and the collector contact diffusion layer 17 will be surrounded by the SiO$_2$ films (see FIG. 4E). This design enables a smaller emitter-base capacitance. In addition, since the emitter diffusion layer 15, the collector contact diffusion layer 17, and the base contact diffusion layer 16 are out of direct contact with each other, a junction breakdown voltage can be high. As shown in FIG. 4E, the bottom 101 of the groove 208 (see FIG. 4B) is lower than the bottom surfaces of the emitter diffusion layer 15 and the collector contact diffusion layer 17 but is higher than the bottom surface of the base diffusion layer 5.

It should be noted that the following alternative process may be used in the formation of the emitter diffusion layer 15, the base contact diffusion layer 16, and the collector contact diffusion layer 17. Before a p-type-impurity doped polycrystalline silicon film for the base lead-out electrode 13 is deposited on the semiconductor body, the semiconductor body is subjected to a thermal treatment at 950° C. for about 40 minutes to form the emitter diffusion layer 15 and the collector contact diffusion layer 17. Then, the base lead-out electrode 13 is formed. Subsequently, the semiconductor body is subjected to a thermal treatment at 900° C. for about 30 minutes to form the base contact diffusion layer 16. In this alternative process, the step of diffusing p-type impurity is executed at the final stage. The alternative process is used in view of the fact that p-type impurity has a large diffusion coefficient.

Figure 4F:
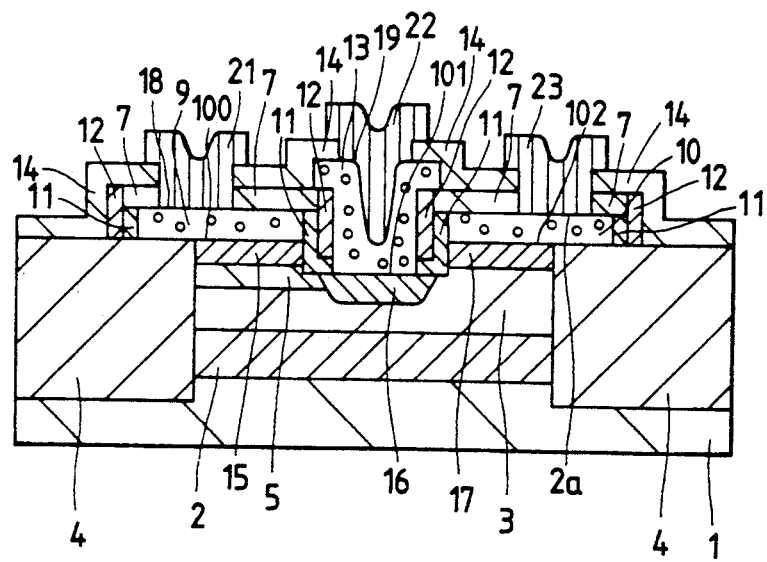

Subsequently, an emitter contact window 18, a base contact window 19, and a collector contact window 20 are formed in the SiO$_2$ films 7 and 14. Then, electrode leads 21, 22, and 23 of aluminum or the like are formed which extend into the emitter contact window 18, the base contact window 19, and the collector contact window 20 respectively. As a result, the bipolar semiconductor device is completed (see FIG. 4F).

It should be noted that contact windows 18, 19, and 20 may be formed on the isolating oxide film to reduce the semiconductor-element size.

DESCRIPTION OF THE FOURTH PREFERRRED EMBODIMENT

Figure 5A:
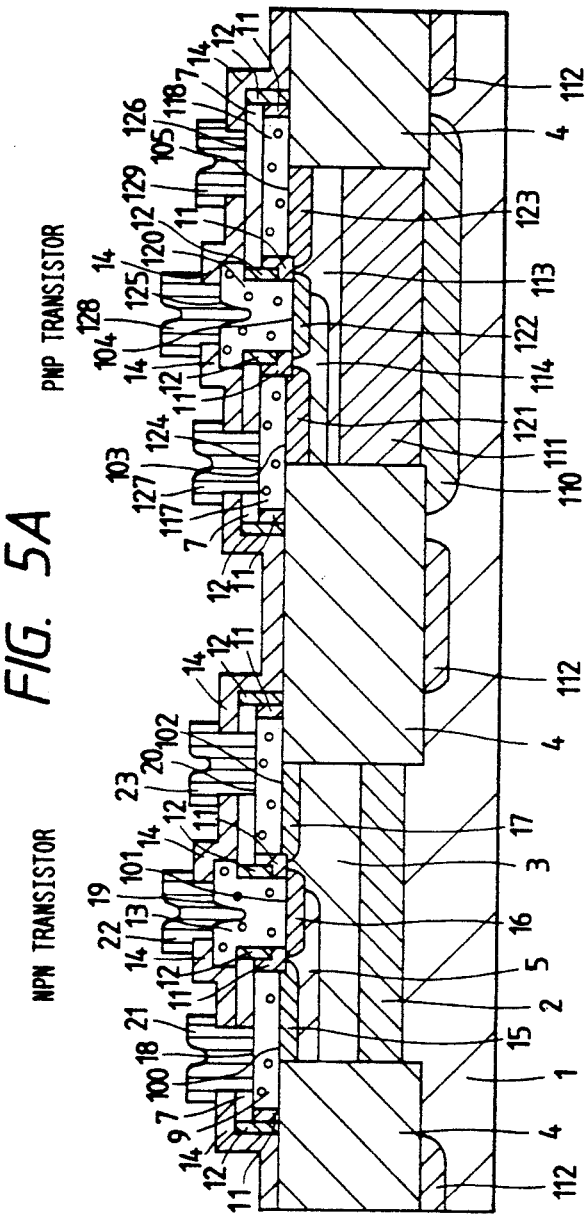
FIG. 5A is a sectional view of a semiconductor device fabricated by a method according to a fourth embodiment of this invention.

FIG. 5A shows a completed bipolar semiconductor device fabricated by a method according to a fourth embodiment of this invention. The bipolar semiconductor device of FIG. 5A includes an NPN transistor and a PNP transistor formed on a common p-type (111) semiconductor substrate 1. The NPN transistor and the PNP transistor are separated by an isolating region 4 consisting of an SiO$_2$ film.

As shown in FIG. 5A, the PNP transistor includes an n-type buried layer 110, a p-type buried layer 111, a p-type channel stopper 112, a p-type well region 113, a base diffusion layer 114, an emitter lead-out electrode 117 consisting of a polycrystalline silicon film containing p-type impurity such as boron, a collector lead-out electrode 118 consisting of a polycrystalline silicon film containing p-type impurity such as boron, a base lead-out electrode 120 consisting of a polycrystalline silicon film containing n-type impurity such as arsenic or phosphorous, an emitter diffusion layer 121, a base contact diffusion layer 122, a collector contact diffusion layer 123, an emitter contact window 124, a base contact window 125, a collector contact window 126, electrode leads 127–129 of aluminum or th elike, an emitter contact 103, a base contact 104, and a collector contact 105.

The NPN transistor includes an n-type buried layer 2, an n-type epitaxial layer 3, an isolating region 4 consisting of an SiO$_2$ film, a base diffusion layer 5, SiO$_2$ films 11, 12, and 14, an emitter lead-out electrode 9 consisting of a polycrystalline silicon film containing n-type impurity (for example, arsenic or phosphorus), a collector lead-out electrode 10 consisting of a polycrystalline silicon film containing n-type impurity (for example, arsenic or phosphorus), a base lead-out electrode 13 consisting of a polycrystalline silicon film containing p-type impurity (for example, boron), an emitter diffusion layer 15, a base contact diffusion layer 16, a collector contact diffusion layer 17, an emitter contact window 18, a base contact window 19, a collector contact window 20, electrode leads 21-23 of aluminum or the like, an emitter contact 100, a base contact 101, and a collector contact 102.

The method of fabricating the bipolar semiconductor device of FIG. 5A will now be described with reference to FIGS. 5B-5L. A p-type (111) semiconductor substrate 1 having a resistivity of 10–20 Ω.cm is masked by a resist of a predetermined pattern. Suitable ions are implanted into a PNP-transistor-forming region of the substrate 1 to form an n-type buried layer 110. During this ion implantation, the acceleration energy (the implanting energy) is 80 keV. The implanted quantity of ions is $1 \times 10^{13}/cm^2$. After the semiconductor substrate 1 is masked by another resist of a predetermined pattern, boron ions are implanted into the substrate 1 with the mask to form a p-type buried layer 111. During the boron ion implantation, the acceleration energy (the implanting energy) is 60 keV. The implanted quantity of boron ions is $1 \times 10^{14}/cm^2$. After the semiconductor substrate 1 is masked by a new resist of a predetermined pattern, arsenic ions are implanted into an NPN-transistor-forming region of the substrate 1 to form an n-type buried layer 2. During the arsenic ion implantation, the acceleration energy (the implanting energy) is 60 keV. The implanted quantity of arsenic ions is $1 \times 10^{15}/cm^2$. Then, an n-type epitaxial layer 3 is formed on the n-type buried layer 2. The n-type epitaxial layer 3 has a resistivity of 1.0 Ω-cm and a thickness of about 1.5 μm. Next, an isolating region 4 is formed by, for example, a box isolation process. A p-type channel stopper 112 is formed in advance in a region below the isolating region 4.

Silicon on the surface of each island region surrounded by the isolating region 4 is exposed. After the semiconductor body is masked by a resist of a predetermined pattern, boron ions are implanted into the PNP-transistor-forming island region of the substrate 1 to form a p-type well region 113 which will form a collector of the PNP transistor. During the boron ion implantation, the acceleration energy (the implanting energy) is 60 keV. The implanted quantity of boron ions is $1.0 \times 10^{12}/cm^2$. After the semiconductor body is masked by a new resist of a predetermined pattern, phosphorus ions are implanted into the PNP-transistor-forming island region of the substrate 1 to form a base diffusion layer 114 of the PNP transistor. During the phosphorus ion implantation, the acceleration energy (the implanting energy) is 60 keV. The implanted quantity of phosphorus ions is $2.0 \times 10^{13}/cm^2$.

After the epitaxial layer 3 is masked by a resist of a predetermined pattern, boron ions are implanted into an NPN-transistor-forming region of the epitaxial layer 3 to form a base diffusion layer 5 of the NPN transistor. During the boron ion implantation, the acceleration energy (the implanting energy) is 20 keV. The implanted quantity of boron ions is $1.5 \times 10^{13}/cm^2$.

It should be noted that the following alternative process may be used in the formation of the base diffusion layers 5 and 114. A thin $SiO_2$ film is formed on the surfaces of the island regions, and ions are implanted into the substrate 1 via the thin $SiO_2$ film to form base diffusion layers 5 and 114. Then, the thin $SiO_2$ film is removed.

Figure 5B:
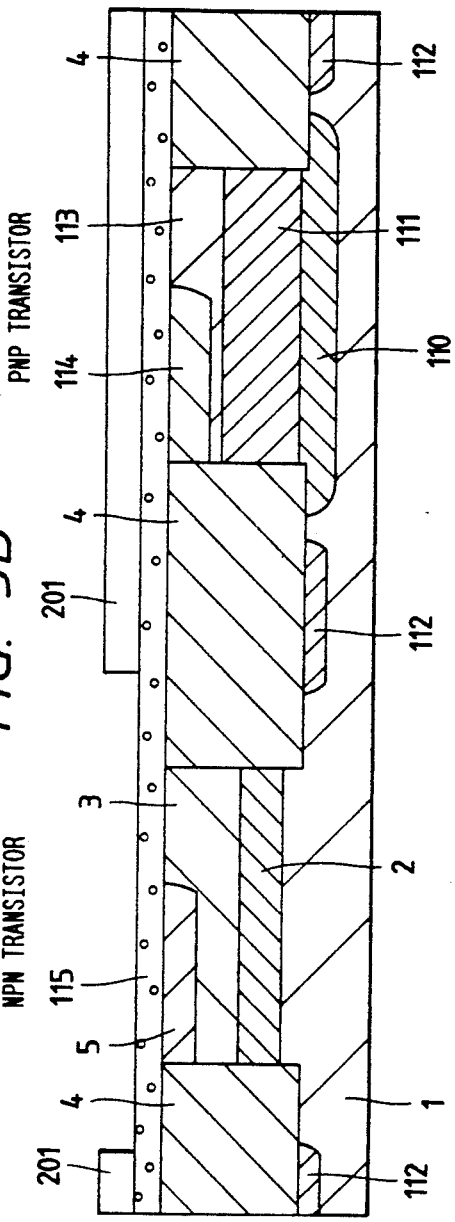

After the mask resist is removed, a polycrystalline silicon film 115 is deposited on the semiconductor body by, for example, a reduced-pressure CVD process (see FIG. 5B). The polycrystalline silicon film 115 has a thickness of about 3,000 Å. After the semiconductor body is masked by a resist 201 of a predetermined pattern (see FIG. 5B), arsenic ions are implanted into a part of the polycrystalline silicon film 115 which extends above the NPN-transistor-forming island region. During the arsenic ion implantation, the acceleration energy (the implanting energy) is 60 keV. The implanted quantity of arsenic ions is $1 \times 10^{16}/cm^2$. After the resist mask 201 is removed, the semiconductor body is masked by a new resist 202 of a predetermined pattern (see FIG. 5C). Then, boron ions are implanted into a part of the polycrystalline silicon film 115 which extends above the PNP-transistor-forming island region. During the boron ion implantation, the acceleration energy (the implanting energy) is 20 keV. The implanted quantity of boron ions is $1 \times 10^{16}/cm^2$.

Then, an $SiO_2$ film 7 is deposited on the semiconductor body by, for example, a CVD process. The $SiO_2$ film 7 has a thickness of about 2,500 Å. The $SiO_2$ film 7 is masked by a resist 203 of a predetermined pattern (see FIG. 5D). The semiconductor body with the mask is subjected to an anisotropic dry etching process so that the $SiO_2$ film 7 and the polycrystalline silicon film 115 are removed from regions for an NPN-transistor base contact 101 and a PNP-transistor base contact 104 to form openings 8 and 116. At the same time, a polycrystalline silicon film pattern for an NPN-transistor emitter lead-out electrode 9, an NPN-transistor collector lead-out electrode 10, a PNP-transistor emitter lead-out electrode 117, and a PNP-transistor collector lead-out electrode 118 is formed by remaining portions of the polycrystalline silicon film 115 (see FIG. 5D). Thereby, an emitter contact 100, a base contact 101, and a collector contact 102 of the NPN transistor can be formed in a self-aligned manner. In addition, an emitter contact 103, a base contact 104, and a collector contact 105 of the PNP transistor can be formed in a self-aligned manner.

After the resist 203 is removed, the semiconductor body is subjected to an oxidization process to form an $SiO_2$ film 11 (see FIG. 5E). The oxidization process is executed at 900° C. for about 30 minutes. The $SiO_2$ film 11 has a thickness of about 500 Å. Then, an $SiO_2$ film 12 is deposited on the semiconductor body by, for example, a CVD process (see FIG. 5E). The $SiO_2$ film 12 has a thickness of about 2,000 Å.

The semiconductor body with the $SiO_2$ films 11 and 12 is subjected to an anisotropic dry etching process to leave only parts of the $SiO_2$ films 11 and 12 which extend at sides of the polycrystalline films for the emitter lead-out electrodes 9 and 117 and the collector lead-out electrodes 10 and 118 (see FIG. 5F). Subsequently, a polycrystalline silicon film 119 is deposited on the semiconductor body by, for example, a reduced-pressure CVD process (see FIG. 5G). This polycrystalline silicon film 119 has a thickness of about 3,000 Å. After the semiconductor body is masked by a resist 204 of a predetermined pattern, boron ions are implanted into the part of the polycrystalline silicon film 119 which extends above the NPN-transistor-forming island region (see FIG. 5G). During the boron ion implantation, the acceleration energy (the implanting energy) is 20 keV. The implanted quantity of boron ions is $1 \times 10^{15}/cm^2$. After the mask resist 204 is removed, the semiconductor body is masked by a new resist 205 of a predetermined pattern (see FIG. 5H). Then, arsenic ions are implanted into the part of the polycrystalline silicon film 119 which extends above the PNP-transistor-forming island region (see FIG. 5H). During the arsenic ion implantation, the acceleration energy (the implanting energy) is 30 keV. The implanted quantity of arsenic ions is $1 \times 10^{15}/cm^2$. After the resist 205 is removed, the polycrystalline silicon film 119 is masked by a new resist 206 of a predetermined pattern. The polycrystalline silicon film 119 with the mask is exposed to a dry etching process to form the base lead-out electrode 13 of the NPN transistor and the base lead-out electrode 120 of the PNP transistor (see FIG. 5I).

After the resist 206 is removed, an $SiO_2$ film 14 is deposited on the semiconductor body by, for example, a CVD process. The $SiO_2$ film 14 has a thickness of about 2,000 Å. Then, the semiconductor body with the $SiO_2$ film 14 is subjected to a thermal treatment at 950° C. for about 40 minutes so that n-type impurity is diffused from the emitter lead-out electrode 9 and the collector lead-out electrode 10 of the NPN transistor to form an emitter diffusion layer 15 and a collector contact diffusion layer 17 of the NPN transistor, and the p-type impurity is diffused from the base lead-out electrode 13 of the NPN transistor to form a base contact diffusion layer 16 of the NPN transistor. At the same time, p-type impurity is diffused from the emitter lead-out electrode 117 and the collector lead-out electrode 118 of the PNP transistor to form an emitter diffusion layer 121 and a collector contact diffusion layer 123 of the PNP transistor, and n-type impurity is diffused from the base lead-out electrode 120 of the PNP transistor to form a base contact diffusion layer 122 of the PNP transistor. The diffusion process is designed so that emitter-base junctions and base-collector junctions of the NPN transistor and the PNP transistor will be located below the $SiO_2$ films 11 and 12 which extend at the sides of the emitter lead-out electrodes 9 and 117 and the collector lead-out electrodes 10 and 118 (see FIG. 5J). Specifically, opposing ends of the emitter diffusion layer 15 and the base contact diffusion layer 16 are located directly below the portions of the $SiO_2$ films 11 and 12 which extend between the emitter lead-out electrode 9 and the base lead-out electrode 13. In addition, opposing ends of the collector contact diffusion layer 17 and the base contact diffusion layer 16 are located directly below the portions of the $SiO_2$ films 11 and 12 which extend between the collector lead-out electrode 10 and the base lead-out electrode 13. Furthermore, opposing ends of the emitter diffusion layer 121 and the base contact diffusion layer 122 are located directly below the portions of the $SiO_2$ films 11 and 12 which extend between the emitter lead-out electrode 117 and the base lead-out electrode 120. In addition, opposing ends of the collector contact diffusion layer 123 and the base contact diffusion layer 122 are located directly below the portions of the $SiO_2$ films 11 and 12 which extend between the collector lead-out electrode 118 and the base lead-out electrode 120.

For a high junction breakdown voltage, it is preferable to optimize the thickness of the $SiO_2$ film 12 and the conditions of the thermal treatment to prevent the emitter diffusion layer 15, the collector contact diffusion layer 17, and the base contact diffusion layer 16 from directly contacting with each other, and also to prevent the emitter diffusion layer 121, the collector contact diffusion layer 123, and the base contact diffusion layer 122 from directly contacting with each other.

It should be noted that the following alternative process may be used in the formation of the emitter diffusion layers 15 and 121, the base contact diffusion layers 16 and 122, and the collector contact diffusion layers 17 and 123. Before a polycrystalline silicon film for the base lead-out electrodes 13 and 120 is deposited on the semiconductor body, the semiconductor body is subjected to a thermal treatment at 950° C. for about 40 minutes to form the emitter diffusion layers 15 and 121 and the collector contact diffusion layers 17 and 123. Then, the base lead-out electrodes 13 and 120 are formed. Subsequently, the semiconductor body is subjected to a thermal treatment at 900° C. for about 30 minutes to form the base contact diffusion layers 16 and 122.

Subsequently, an emitter contact window 18, a base contact window 19, and a collector contact window 20 of the NPN transistor are formed in the $SiO_2$ films 7 and 14. In addition, an emitter contact window 124, a base contact window 125, and a collector contact window 126 of the PNP transistor are formed in the $SiO_2$ films 7 and 14. Then, electrode leads 21, 22, 23, 127, 128, and 129 of aluminum or the like are formed which extend into the windows 18, 19, 20, 124, 125, and 126 respectively. As a result, the bipolar semiconductor device is completed (see FIG. 5K).

In summary, the NPN transistor and the PNP transistor are formed simultaneously. In each of the NPN transistor and the PNP transistor, the emitter lead-out electrode and the collector lead-out electrode are simultaneously formed from an impurity-doped polycrystalline silicon film. In addition, the region surrounded by the polycrystalline silicon films composing the emitter lead-out electrode and the collector lead-out electrode is used as a base contact region. Insulating films formed on side and upper surfaces of the polycrystalline silicon films provide insulation between the emitter lead-out electrode, the collector lead-out electrode, and the base lead-out electrode. Thereby, the base contact, the emitter contact, and the collector contact are formed in a self-aligned manner. Thus, it is possible to fabricate a semiconductor device having a small semiconductor-element size, a small emitter-base capacitance, a small base-emitter capacitance, a small base resistance, a small collector-substrate capacitance, and a small collector resistance. These small parameters of the semiconductor device enables a high speed operation of the semiconductor device.

Figures 5K, 5L:
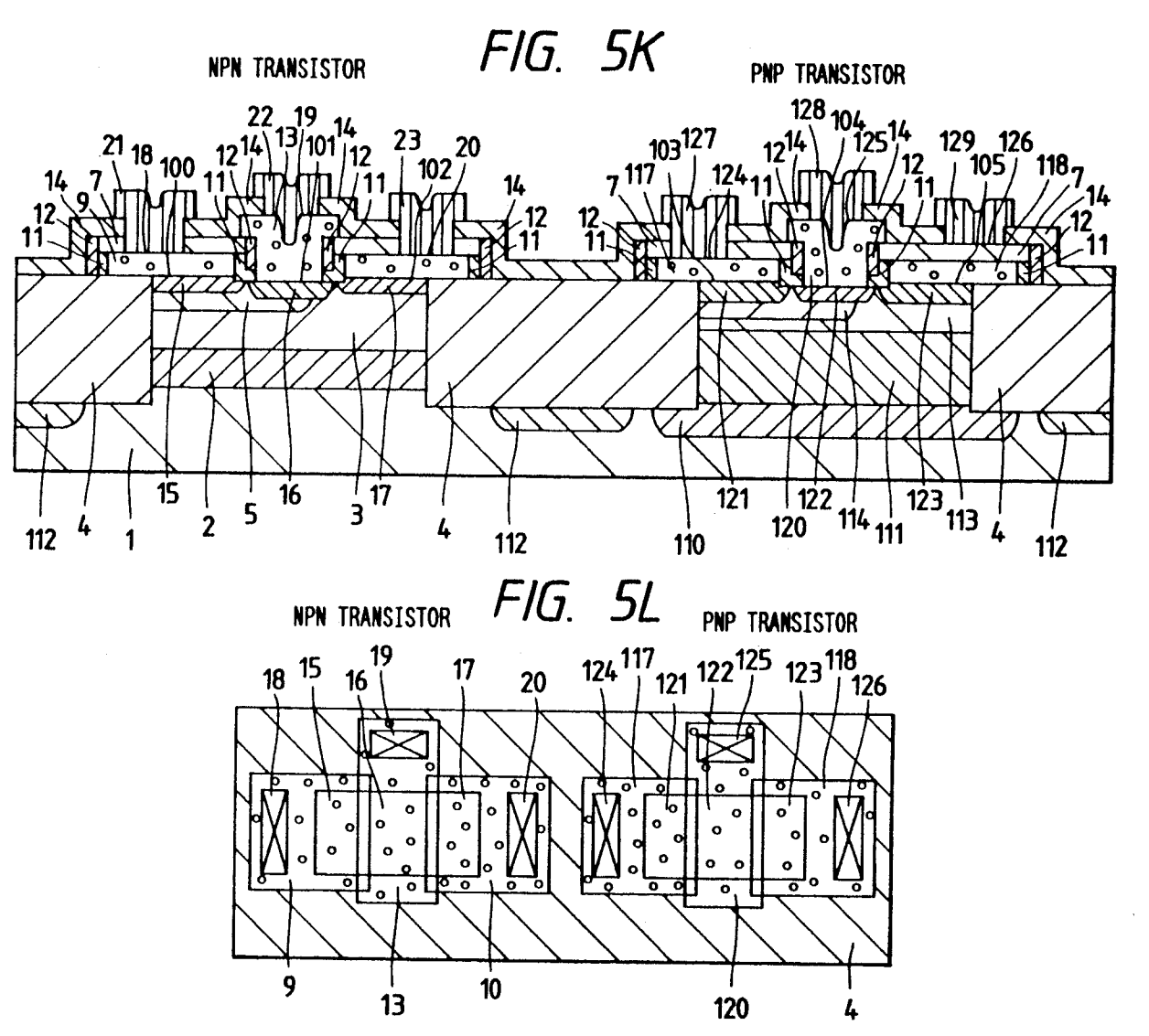

FIG. 5L shows a modification of this embodiment. In this modification, contact windows 18, 19, 20, 124, 125, and 126 are formed on the isolating oxide film. This modification enables a smaller semiconductor-element size.

DESCRIPTION OF THE FIFTH PREFERRED EMBODIMENT

FIG. 6A shows a completed bipolar semiconductor device fabricated by a method according to a fifth embodiment of this invention. The structure of the bipolar semiconductor device of FIG. 6A is basically similar to the structure of the bipolar semiconductor device of FIG. 5A. A detailed description of the structure of the bipolar semiconductor device of FIG. 6A will be omitted.

The method of fabricating the bipolar semiconductor device of FIG. 6A will now be described with reference to FIGS. 6B–6K. After a p-type (111) semiconductor substrate 1 having a resistivity of 10–20 $\Omega$.cm is masked by a resist of a predetermined pattern, suitable ions are implanted into a PNP-transistor-forming region of the substrate 1 to form an n-type buried layer 110. During this ion implantation, the acceleration energy (the implanting energy) is 80 keV. The implanted quantity of ions is $1 \times 10^{13}/cm^2$. Then, the semiconductor substrate 1 is masked by another resist of a predetermined pattern. Boron ions are implanted into the substrate 1 with the mask to form a p-type buried layer 111. During the boron ion implantation, the acceleration energy (the implanting energy) is 60 keV. The implanted quantity of boron ions is $1 \times 10^{14}/cm^2$. After the semiconductor substrate 1 is masked by a new resist of a predetermined pattern, arsenic ions are implanted into an NPN-transistor-forming region of the substrate 1 to form an n-type buried layer 2. During the arsenic ion implantation, the acceleration energy (the implanting energy) is 60 keV. The implanted quantity of arsenic ions is $1 \times 10^{15}/cm^2$. Then, an n-type epitaxial layer 3 is formed on the n-type buried layer 2. The n-type epitaxial layer 3 has a resistivity of 1.0 $\Omega$.cm and a thickness of about 1.5 $\mu$m. Next, an isolating region 4 is formed by, for example, a box isolation process. A p-type channel stopper 112 is formed in advance in a region below the isolating region 4.

Silicon on the surface of each island region surrounded by the isolating region 4 is exposed. After the semiconductor body is masked by a resist of a predetermined pattern, boron ions are implanted into the PNP-transistor-forming island region of the substrate 1 to form a p-type well region 113 which will form a collector of the PNP transistor. During the boron ion implantation, the acceleration energy (the implanting energy) is 60 keV. The implanted quantity of boron ions is $1.0 \times 10^{12}/cm^2$. After the semiconductor body is masked by a new resist of a predetermined pattern, phosphorus ions are implanted into the PNP-transistor-forming island region of the substrate 1 to form a base diffusion layer 114 of the PNP transistor. During the phosphorus ion implantation, the acceleration energy (the implanting energy) is 60 keV. The implanted quantity of phosphorus ions is $2.0 \times 10^{13}/cm^2$.

After the epitaxial layer 3 is masked by a new resist of a predetermined pattern, boron ions are implanted into an NPN-transistor-forming region of the epitaxial layer 3 to form a base diffusion layer 5 of the NPN transistor. During the boron ion implantation, the acceleration energy (the implanting energy) is 20 keV. The implanted quantity of boron ions is $1.5 \times 10^{13}/cm^2$.

It should be noted that the following alternative process may be used in the formation of the base diffusion layers 5 and 114. A thin $SiO_2$ film is formed on the surfaces of the island regions, and ions are implanted into the substrate 1 via the thin $SiO_2$ film to form base diffusion layers 5 and 114. Then, the thin $SiO_2$ film is removed.

After the mask resist is removed, a polycrystalline silicon film 115 is deposited on the semiconductor body by, for example, a reduced-pressure CVD process (see FIG. 6B). The polycrystalline silicon film 115 has a thickness of about 3,000 Å, and contains n-type impurity such as arsenic or phosphorus.

It should be noted that the following alternative process may be used in the formation of the impurity-doped polycrystalline silicon film 115. After a non-doped polycrystalline silicon film 115 is deposited on the semiconductor body, arsenic ions are implanted into the non-doped polycrystalline silicon film 115. During the arsenic ion implantation, the acceleration energy (the implanting energy) is 60 keV. The implanted quantity of arsenic ions is $1 \times 10^{16}/cm^2$.

Then, an $SiO_2$ film 7 is deposited on the semiconductor body by, for example, a CVD process. The $SiO_2$ film 7 has a thickness of about 2,500 Å. The $SiO_2$ film 7 is masked by a resist 203 of a predetermined pattern (see FIG. 6C). The semiconductor body with the mask is subjected to an anisotropic dry etching process so that the $SiO_2$ film 7 and the polycrystalline silicon film 115 are removed from a region for an NPN-transistor base contact 101 to form an opening 8. At the same time, the $SiO_2$ film 7 and the polycrystalline silicon film 115 which extend above a region for a PNP-transistor base contact 104 are left, and a polycrystalline silicon film pattern for an NPN-transistor emitter lead-out electrode 9, an NPN-transistor collector lead-out electrode 10, and a PNP-transistor base lead-out electrode 120 is formed by remaining portions of the polycrystalline silicon film 115 (see FIG. 6C). Thereby, an emitter contact 100, a base contact 101, and a collector contact 102 of the NPN transistor can be formed in a self-aligned manner. In addition, an emitter contact 103, a base contact 104, and a collector contact 105 of the PNP transistor can be formed in a self-aligned manner.

After the resist 203 is removed, the semiconductor body is subjected to an oxidization process to form an $SiO_2$ film 11 (see FIG. 6D). The oxidization process is executed at 900° C. for about 30 minutes. The $SiO_2$ film 11 has a thickness of about 500 Å. Then, an $SiO_2$ film 12 is deposited on the semiconductor body by, for example, a CVD process (see FIG. 6D). The $SiO_2$ film 12 has a thickness of about 2,000 Å.

The semiconductor body with the $SiO_2$ films 11 and 12 is subjected to an anisotropic dry etching process to leave only parts of the $SiO_2$ films 11 and 12 which extend at sides of the polycrystalline films for the emitter lead-out electrode 9, the collector lead-out electrode 10, and the base lead-out electrode 120 (see FIG. 6E). Subsequently, a polycrystalline silicon film 119 is deposited on the semiconductor body by, for example, a reduced-pressure CVD process (see FIG. 6F). This polycrystalline silicon film 119 has a thickness of about 3,000 Å, and contains a p-type impurity such as boron.

It should be noted that the following alternative process may be used in the formation of the impurity-doped polycrystalline silicon film 119. After a non-doped polycrystalline silicon film 119 is deposited on the semiconductor body, boron ions are implanted into the non-doped polycrystalline silicon film 119. During the boron ion implantation, the acceleration energy (the implanting energy) is 20 keV. The implanted quantity of boron ions is $1 \times 10^{16}/cm^2$.

Then, the polycrystalline silicon film 119 is masked by a resist 206 of a predetermined pattern. The polycrystalline silicon film 119 with the mask is exposed to a dry etching process to form the base lead-out electrode 13 of the NPN transistor, and the emitter lead-out electrode 117 and the collector lead-out electrode 118 of the PNP transistor (see FIG. 6G).

After the resist 206 is removed, an $SiO_2$ film 14 is deposited on the semiconductor body by, for example, a CVD process. The $SiO_2$ film 14 has a thickness of about 2,000 Å. Then, the semiconductor body with the $SiO_2$ film 14 is subjected to a thermal treatment at 950° C. for about 40 minutes so that n-type impurity is diffused from the emitter lead-out electrode 9 and the collector lead-out electrode 10 of the NPN transistor to form an emitter diffusion layer 15 and a collector contact diffusion layer 17 of the NPN transistor, and that p-type impurity is diffused from the base lead-out electrode 13 of the NPN transistor to form a base contact diffusion layer 16 of the NPN transistor. At the same time, p-type impurity is diffused from the emitter lead-out electrode 117 and the collector lead-out electrode 118 of the PNP transistor to form an emitter diffusion layer 121 and a collector contact diffusion layer 123 of the PNP transistor, and n-type impurity is diffused from the base lead-out electrode 120 of the PNP transistor to form a base contact diffusion layer 122 of the PNP transistor. The diffusion process is designed so that emitter-base junctions and base collector junctions of the NPN transistor and the PNP transistor will be located below the $SiO_2$ films 11 and 12 which extend at the sides of the emitter lead-out electrodes 9 and 117 and the collector lead-out electrodes 10 and 118 (see FIG. 6H). Specifically, opposing ends of the emitter diffusion layer 15 and the base contact diffusion layer 16 are located directly below the portions of the $SiO_2$ films 11 and 12 which extend between the emitter lead-out electrode 9 and the base lead-out electrode 13. In addition, opposing ends of the collector contact diffusion layer 17 and the base contact diffusion layer 16 are located directly below the portions of the $SiO_2$ films 11 and 12 which extend between the collector lead-out electrode 10 and the base lead-out electrode 13. Furthermore, opposing ends of the emitter diffusion layer 121 and the base contact diffusion layer 122 are located directly below the portions of the $SiO_2$ films 11 and 12 which extend between the emitter lead-out electrode 117 and the base lead-out electrode 120. In addition, opposing ends of the collector contact diffusion layer 123 and the base contact diffusion layer 122 are located directly below the portions of the $SiO_2$ films 11 and 12 which extend between the collector lead-out electrode 118 and the base lead-out electrode 120.

For a high junction breakdown voltage, it is preferable to optimize the thickness of the $SiO_2$ film 12 and the conditions of the thermal treatment to prevent the emitter diffusion layer 15, the collector contact diffusion layer 17, and the base contact diffusion layer 16 from directly contacting with each other, and also to prevent the emitter diffusion layer 121, the collector contact diffusion layer 123, and the base contact diffusion layer 122 from directly contacting with each other.

It should be noted that the following alternative process may be used in the formation of the emitter diffusion layers 15 and 121, the base contact diffusion layers 16 and 122, and the collector contact diffusion layers 17 and 123. Before a polycrystalline silicon film for the base lead-out electrode 13, the emitter lead-out electrode 117, and the collector lead-out electrode 118 is deposited on the semiconductor body, the semiconductor body is subjected to a thermal treatment at 950° C. for about 40 minutes to form the emitter diffusion layer 15, the collector contact diffusion layer 17, and the base contact diffusion layer 122. Then, the base lead-out electrode 13, the emitter lead-out electrode 117, and the collector lead-out electrode 118 are formed. Subsequently, the semiconductor body is subjected to a thermal treatment at 900° C. for about 30 minutes to form the base contact diffusion layer 16, the emitter diffusion layer 121, and the collector contact diffusion layer 123.

Subsequently, an emitter contact window 18, a base contact window 19, and a collector contact window 20 of the NPN transistor are formed in the SiO2 films 7 and 14. In addition, an emitter contact window 124, a base contact window 125, and a collector contact window 126 of the PNP transistor are formed in the SiO2 films 7 and 14. Then, electrode leads 21, 22, 23, 127, 128, and 129 of aluminum or the like are formed which extend into the windows 18, 19, 20, 124, 125, and 126 respectively. As a result, the bipolar semiconductor device is completed (see FIG. 6I). It should be noted that the base contact window 125 for the PNP transistor is formed on the isolating region 4 (see FIG. 6K).

In summary, the NPN transistor and the PNP transistor are formed simultaneously. The emitter lead-out electrode and the collector lead-out electrode of the NPN transistor, and the base lead-out electrode of the PNP transistor are simultaneously formed from an impurity-doped polycrystalline silicon film. In addition, the base lead-out electrode of the NPN transistor, and the emitter lead-out electrode and the collector lead-out electrode of the PNP transistor are simultaneously formed from the impurity-doped polycrystalline silicon film. Furthermore, in each of the NPN transistor and the PNP transistor, insulating films formed on side and upper surfaces of the polycrystalline silicon films provide insulation between the emitter lead-out electrode, the collector lead-out electrode, and the base lead-out electrode. Thereby, the base contact, the emitter contact, and the collector contact are formed in a self-aligned manner. Thus, it is possible to fabricate a semiconductor device having a small semiconductor-element size, a small emitter-base capacitance, a small base-emitter capacitance, a small base resistance, a small collector-substrate capacitance, and a small collector resistance. These small parameters of the semiconductor device enables a high speed operation of the semiconductor device.

It should be noted that the contact windows 18, 19, 20, 124, and 126 may be formed on the isolating oxide film (see FIG. 6K). This modification enables a smaller semiconductor-element size.

What is claimed is:

1. A method of fabricating a semiconductor device, comprising the steps of:
    forming a base diffusion layer (5) in a predetermined region in a semiconductor substrate of a first conduction type, the base diffusion layer being of a second conduction type;
    forming first insulating films (7) and simultaneously forming an emitter lead-out electrode (9) and a collector lead-out electrode (10) in regions above an emitter-contact-forming region and a collector-contact-forming region, the first insulating films extending on the emitter and collector lead-out electrodes, the emitter and collector lead-out electrodes including impurity corresponding to the first conduction type;
    forming second insulating films (11, 12) at sides of the emitter and collector lead-out electrodes;
    forming a base contact (101);
    forming a base lead-out electrode (13) including impurity corresponding to the second conduction type;
    diffusing the impurity from the emitter lead-out electrode, the collector lead-out electrode, and the base lead-out electrode to form an emitter diffusion layer (15) of the first conduction type, a collector contact diffusion layer (17) of the first conduction type, and a base contact diffusion layer (16) of the second conduction type;
    locating an end of the emitter diffusion layer (15) and a first end of the base contact diffusion layer (16) at positions directly below a portion of the second insulating films (11, 12) which extends at a side of the emitter lead-out electrode (9); and
    locating a second end of the base contact diffusion layer (16) and an end of the collector contact diffusion layer (17) at positions directly below a portion of the second insulating films (11, 12) which extends at a side of the collector lead-out electrode (10).

2. The method of claim 1 wherein the second insulating-film forming step comprises forming first portions of the second insulating films by a thermal oxidization process, and forming second portions of the second insulating films by a CVD process.

3. The method of claim 1 further comprising the step of forming the emitter lead-out electrode, the collector lead-out electrode, and the base lead-out electrode from polycrystalline silicon films.

4. The method of claim 1 further comprising the steps of diffusing the impurity from the emitter lead-out electrode and the collector lead-out electrode to form the emitter diffusion layer and the collector contact diffusion layer after a formation of the second insulating films, and diffusing the impurity from the base lead-out electrode to form the base contact diffusion layer after a formation of the base lead-out electrode.

5. The method of claim 1 further comprising the step of preventing the emitter diffusion layer and the base contact diffusion layer from directly contacting with each other.

6. The method of claim 1 further comprising the step of preventing the collector contact diffusion layer and the base contact diffusion layer from directly contacting with each other.

7. A method of fabricating a semiconductor device, comprising the steps of:
    forming a base diffusion layer (5) in a predetermined region in a semiconductor substrate of a first conduction type, the base diffusion layer being of a second conduction type;

forming first insulating films (7) and simultaneously forming an emitter lead-out electrode (9) and a collector lead-out electrode (10) in regions above an emitter-contact-forming region and a collector-contact-forming region, the first insulating films extending on the emitter and collector lead-out electrodes, the emitter and collector lead-out electrodes including impurity corresponding to the first conduction type;

forming second insulating films (11, 12) at sides of the emitter and collector lead-out electrodes;

forming a base contact (101);

implanting ions corresponding to the second conduction type into a base-contact-forming region to form a base contact diffusion layer (16) while using the first and second insulating films as masks;

diffusing the impurity from the emitter lead-out electrode and the collector lead-out electrode to form an emitter diffusion layer (15) of the first conduction type and a collector contact diffusion layer (17) of the first conduction type;

locating an end of the emitter diffusion layer (15) and a first end of the base contact diffusion layer (16) at positions directly below a portion of the second insulating films (11, 12) which extends at a side of the emitter lead-out electrode (9); and locating a second end of the base contact diffusion layer (16) and an end of the collector contact diffusion layer (17) at positions directly below a portion of the second insulating films (11, 12) which extends at a side of the collector lead-out electrode (10).

8. The method of claim 7 wherein the second insulating film forming step comprises forming first portions of the second insulating films by a thermal oxidization process, and forming second portions of the second insulating films by a CVD process.

9. The method of claim 7 further comprising the step of forming the emitter lead-out electrode, the collector lead-out electrode, and the base lead-out electrode from polycrystalline silicon films.

10. The method of claim 7 further comprising the steps of diffusing the impurity from the emitter lead-out electrode and the collector lead-out electrode to form the emitter diffusion layer and the collector contact diffusion layer after a formation of the second insulating films, and implanting the ions corresponding to the second conduction type into the base-contact-forming region to form the base contact diffusion layer while using the first and second insulating films as the masks.

11. The method of claim 7 further comprising the step of preventing the emitter diffusion layer and the base contact diffusion layer from directly contacting with each other.

12. The method of claim 7 further comprising the step of preventing the collector contact diffusion layer and the base contact diffusion layer from directly contacting with each other.

13. A method of fabricating a semiconductor device, comprising the steps of:

forming a base diffusion layer (5) in a predetermined region in a semiconductor substrate of a first conduction type, the base diffusion layer being of a second conduction type;

forming first insulating films (7) and simultaneously forming an emitter lead-out electrode (9) and a collector lead-out electrode (10) in regions above an emitter-contact-forming region and a collector-contact-forming region, the first insulating films extending on the emitter and collector lead-out electrodes, the emitter and collector lead-out electrodes including impurity corresponding to the first conduction type;

etching a region of the semiconductor substrate, which is sandwiched between the emitter lead-out electrode and the collector lead-out electrode, to form a groove (208) in the semiconductor substrate;

forming second insulating films (11, 12) at sides of the emitter lead-out electrode, the collector lead-out electrode, and the groove;

forming a base contact (101);

forming a base lead-out electrode (13) including impurity corresponding to the second conduction type;

diffusing the impurity from the emitter lead-out electrode, the collector lead-out electrode, and the base lead-out electrode to form an emitter diffusion layer (15) of the first conduction type, a collector contact diffusion layer (17) of the first conduction type, and a base contact diffusion layer (16) of the second conduction type;

locating a bottom (101) of the groove at a position lower than a bottom surface of the emitter diffusion layer (15) and a bottom surface of the collector contact diffusion layer (17); and locating the bottom (101) of the groove at a position higher than a bottom surface of the base diffusion layer (5).

14. The method of claim 13 wherein the second insulating-film forming step comprises forming first portions of the second insulating films by a thermal oxidization process, and forming second portions of the second insulating films by a CVD process.

15. The method of claim 13 further comprising the step of forming the emitter lead-out electrode, the collector lead-out electrode, and the base lead-out electrode from polycrystalline silicon films.

16. The method of claim 13 further comprising the steps of diffusing the impurity from the emitter lead-out electrode and the collector lead-out electrode to form the emitter diffusion layer and the collector contact diffusion layer after a formation of the second insulating films, and implanting ions corresponding to the second conduction type into a base-contact-forming region to form the base contact diffusion layer while using the first and second insulating films as masks.

* * * * *